United States Patent
Arai et al.

(10) Patent No.: US 9,138,913 B2
(45) Date of Patent: Sep. 22, 2015

(54) TRANSPARENT MATERIAL PROCESSING WITH AN ULTRASHORT PULSE LASER

(75) Inventors: Alan Y. Arai, Fremont, CA (US); Gyu C. Cho, Ann Arbor, MI (US); Jingzhou Xu, Ann Arbor, MI (US); Fumiyo Yoshino, San Jose, CA (US); Haibin Zhang, Portland, OR (US); James Bovatsek, San Jose, CA (US); Makoto Yoshida, Ann Arbor, MI (US)

(73) Assignee: IMRA AMERICA, INC., Ann Arbor, MI (US)

( * ) Notice: Subject to any disclaimer, the term of this patent is extended or adjusted under 35 U.S.C. 154(b) by 1241 days.

(21) Appl. No.: 12/397,567

(22) Filed: Mar. 4, 2009

(65) Prior Publication Data
US 2010/0025387 A1    Feb. 4, 2010

Related U.S. Application Data

(60) Provisional application No. 61/064,476, filed on Mar. 7, 2008, provisional application No. 61/146,536, filed on Jan. 22, 2009.

(51) Int. Cl.
*B23K 26/00* (2014.01)
(Continued)

(52) U.S. Cl.
CPC .............. *B28D 5/00* (2013.01); *B23K 26/0635* (2013.01); *B23K 26/4075* (2013.01);
(Continued)

(58) Field of Classification Search
CPC ........... B23K 26/0635; B23K 26/4075; B29C 65/1606; B29C 65/1612; B29C 65/1619; B29C 65/1629; B29C 65/1635; B29C 65/1638; B29C 65/1654; B29C 65/1658; B29C 65/1687; B29C 65/38; B29C 66/1122
USPC ............. 219/121.68–121.69, 121.73, 121.85, 219/121.67, 121.72, 121.84, 121.61; 362/559; 347/224; 264/400
See application file for complete search history.

(56) References Cited

U.S. PATENT DOCUMENTS

| 4,424,435 A | 1/1984 | Barnes |
| 4,914,815 A | 4/1990 | Takada |

(Continued)

FOREIGN PATENT DOCUMENTS

| DE | 19846368 C1 | 4/2000 |
| GB | 2402230A B | 5/2006 |

(Continued)

OTHER PUBLICATIONS

B. Tan et al.; "Dual-Focus Laser Micromachining", J. of Modern Optics vol. 52, No. 17 Nov. 2005, 2603-2611.
(Continued)

*Primary Examiner* — Dana Ross
*Assistant Examiner* — Ket D Dang
(74) *Attorney, Agent, or Firm* — Sughrue Mion, PLLC; Richard C. Turner

(57) ABSTRACT

Methods, devices, and systems for ultrashort pulse laser processing of optically transparent materials are presented, with example applications in scribing, marking, welding, and joining. For example, ultrashort laser pulses create multiple scribe features with one pass of the laser beam across the material, with at least one of the scribe features being formed below the surface of the material. Slightly modifying the ultrashort pulse laser processing conditions produces different types of sub-surface marks. When properly arranged, these marks are clearly visible with correctly aligned illumination through either light scattering or light reflection and nearly invisible without illumination. Transparent material other than glass may be utilized. A method for welding transparent materials uses ultrashort laser pulses to create a bond through localized heating. In some embodiments of transparent material processing, a multifocus beam generator simultaneously forms multiple beam waists spaced depthwise relative to the transparent material, thereby increasing processing speed.

20 Claims, 26 Drawing Sheets

(51) Int. Cl.
  *B64D 47/06* (2006.01)
  *B41J 2/435* (2006.01)
  *B29C 35/08* (2006.01)
  *B28D 5/00* (2006.01)
  *B23K 26/06* (2014.01)
  *B23K 26/40* (2014.01)
  *B29C 65/00* (2006.01)
  *B29C 65/16* (2006.01)
  *B29C 65/38* (2006.01)

(52) U.S. Cl.
  CPC ......... *B28D 5/0011* (2013.01); *B29C 65/1629* (2013.01); *B29C 65/1635* (2013.01); *B29C 65/1638* (2013.01); *B29C 65/1654* (2013.01); *B29C 66/1122* (2013.01); *B29C 66/43* (2013.01); *B29C 66/73366* (2013.01); *B29C 66/836* (2013.01); *B29C 65/1606* (2013.01); *B29C 65/1612* (2013.01); *B29C 65/1619* (2013.01); *B29C 65/1658* (2013.01); *B29C 65/1687* (2013.01); *B29C 65/38* (2013.01); *B29C 66/952* (2013.01); *B29K 2995/0026* (2013.01)

(56) References Cited

U.S. PATENT DOCUMENTS

| | | | |
|---|---|---|---|
| 5,230,184 A | 7/1993 | Bukhman | |
| 5,251,003 A | 10/1993 | Vigouroux | |
| 5,304,357 A | 4/1994 | Sato | |
| 5,543,365 A | 8/1996 | Wills | |
| 5,580,473 A | 12/1996 | Shinohara | |
| 5,609,284 A | 3/1997 | Kondratenko | |
| 5,637,244 A | 6/1997 | Erokhin | |
| 5,641,416 A | 6/1997 | Chadha | |
| 5,744,780 A | 4/1998 | Chang | |
| 5,814,532 A | 9/1998 | Ichihara | |
| 5,826,772 A | 10/1998 | Ariglio | |
| 5,835,458 A | 11/1998 | Bischel et al. | |
| 5,840,147 A | 11/1998 | Grimm | |
| 5,841,543 A | 11/1998 | Guldi | |
| 5,843,265 A | 12/1998 | Grimm | |
| 5,916,460 A | 6/1999 | Imoto | |
| 5,925,271 A | 7/1999 | Pollack | |
| 5,972,816 A | 10/1999 | Goto | |
| 5,976,392 A | 11/1999 | Chen | |
| 6,031,201 A | 2/2000 | Amako | |
| 6,103,992 A * | 8/2000 | Noddin | 219/121.71 |
| 6,121,118 A | 9/2000 | Jin | |
| 6,181,728 B1 | 1/2001 | Cordingley | |
| 6,208,458 B1 | 3/2001 | Galvanauskas et al. | |
| 6,211,488 B1 | 4/2001 | Hoekstra | |
| 6,257,224 B1 | 7/2001 | Yoshino | |
| 6,259,058 B1 * | 7/2001 | Hoekstra | 219/121.75 |
| 6,285,002 B1 | 9/2001 | Ngoi | |
| 6,322,958 B1 | 11/2001 | Hayashi | |
| 6,325,855 B1 | 12/2001 | Sillmon | |
| 6,333,486 B1 | 12/2001 | Troitski | |
| 6,399,463 B1 | 6/2002 | Glenn | |
| 6,407,360 B1 | 6/2002 | Choo | |
| 6,417,481 B2 | 7/2002 | Chen | |
| 6,417,485 B1 | 7/2002 | Troitski | |
| 6,420,678 B1 | 7/2002 | Hoekstra | |
| 6,426,480 B1 | 7/2002 | Troitski | |
| 6,444,946 B1 | 9/2002 | Korte | |
| 6,448,569 B1 | 9/2002 | Katsap et al. | |
| 6,472,295 B1 | 10/2002 | Morris | |
| 6,501,044 B1 | 12/2002 | Klockhaus | |
| 6,501,499 B2 | 12/2002 | Hayashi | |
| 6,509,548 B1 | 1/2003 | Troitski | |
| 6,552,301 B2 | 4/2003 | Herman et al. | |
| 6,565,248 B2 | 5/2003 | Honguh | |
| 6,576,863 B1 | 6/2003 | Piltch | |
| 6,653,210 B2 | 11/2003 | Choo | |
| 6,656,315 B2 | 12/2003 | Sallavanti | |
| 6,663,297 B1 | 12/2003 | Goldstein | |
| 6,670,576 B2 | 12/2003 | Troitski | |
| 6,720,521 B2 | 4/2004 | Troitski | |
| 6,734,389 B2 | 5/2004 | Troitski | |
| 6,737,606 B2 | 5/2004 | Peng et al. | |
| 6,744,009 B1 * | 6/2004 | Xuan et al. | 219/121.67 |
| 6,759,458 B2 | 7/2004 | Reil | |
| 6,770,544 B2 | 8/2004 | Sawada | |
| 6,787,732 B1 * | 9/2004 | Xuan et al. | 219/121.67 |
| 6,804,439 B1 | 10/2004 | Pregitzer | |
| 6,838,156 B1 | 1/2005 | Neyer | |
| 6,864,457 B1 * | 3/2005 | Alexander et al. | 219/121.11 |
| 6,911,262 B2 | 6/2005 | Sallavanti | |
| 6,992,026 B2 | 1/2006 | Fukuyo | |
| 7,060,933 B2 | 6/2006 | Burrowes | |
| 7,211,526 B2 | 5/2007 | Iri et al. | |
| 7,294,454 B1 * | 11/2007 | Said et al. | 430/321 |
| 7,538,048 B2 | 5/2009 | Kobayashi | |
| 7,605,344 B2 | 10/2009 | Fukumitsu | |
| 7,626,138 B2 * | 12/2009 | Bovatsek et al. | 219/121.69 |
| 8,247,731 B2 | 8/2012 | Alexander | |
| 8,314,359 B2 | 11/2012 | Bovatsek et al. | |
| 2001/0031115 A1 | 10/2001 | Chen | |
| 2001/0035401 A1 | 11/2001 | Manor | |
| 2002/0079296 A1 | 6/2002 | Dijken | |
| 2002/0115235 A1 | 8/2002 | Sawada | |
| 2002/0141473 A1 * | 10/2002 | Cordingley et al. | 372/106 |
| 2002/0162360 A1 | 11/2002 | Schaffer | |
| 2002/0182877 A1 | 12/2002 | Nantel et al. | |
| 2004/0119955 A1 | 6/2004 | Tanaka | |
| 2004/0226925 A1 | 11/2004 | Gu | |
| 2004/0228004 A1 | 11/2004 | Sercel | |
| 2005/0006361 A1 | 1/2005 | Kobayashi | |
| 2005/0046792 A1 | 3/2005 | Ito | |
| 2005/0064137 A1 | 3/2005 | Hunt et al. | |
| 2005/0129303 A1 | 6/2005 | Smilansky et al. | |
| 2005/0145607 A1 | 7/2005 | Troitski | |
| 2005/0173387 A1 | 8/2005 | Fukuyo | |
| 2005/0181581 A1 | 8/2005 | Fukuyo | |
| 2005/0184037 A1 | 8/2005 | Fukuyo | |
| 2005/0189330 A1 | 9/2005 | Fukuyo | |
| 2005/0194364 A1 | 9/2005 | Fukuyo | |
| 2005/0199599 A1 | 9/2005 | Li | |
| 2005/0279739 A1 * | 12/2005 | Bruland et al. | 219/121.69 |
| 2006/0000814 A1 * | 1/2006 | Gu et al. | 219/121.69 |
| 2006/0021978 A1 | 2/2006 | Alexeev et al. | |
| 2006/0040473 A1 | 2/2006 | Fukuyo | |
| 2006/0086704 A1 | 4/2006 | Nagai et al. | |
| 2006/0091122 A1 | 5/2006 | Sugioka | |
| 2006/0091124 A1 | 5/2006 | Troitski | |
| 2006/0108337 A1 * | 5/2006 | Gu et al. | 219/121.69 |
| 2006/0113287 A1 | 6/2006 | Inada et al. | |
| 2006/0126679 A1 | 6/2006 | Brennan et al. | |
| 2006/0160331 A1 | 7/2006 | Fukuyo | |
| 2006/0196858 A1 * | 9/2006 | Barron et al. | 219/121.69 |
| 2006/0249496 A1 | 11/2006 | Morikazu et al. | |
| 2006/0289410 A1 | 12/2006 | Morita et al. | |
| 2007/0038176 A1 | 2/2007 | Weber et al. | |
| 2007/0051706 A1 * | 3/2007 | Bovatsek et al. | 219/121.69 |
| 2007/0169849 A1 | 7/2007 | Yahagi et al. | |
| 2007/0170159 A1 | 7/2007 | Fukumitsu | |
| 2007/0199927 A1 * | 8/2007 | Gu et al. | 219/121.69 |
| 2007/0215820 A1 * | 9/2007 | Cordingley et al. | 250/492.22 |
| 2007/0298529 A1 | 12/2007 | Maeda | |
| 2008/0047940 A1 | 2/2008 | Li et al. | |
| 2008/0296263 A1 | 12/2008 | Alexander | |

FOREIGN PATENT DOCUMENTS

| | | | |
|---|---|---|---|
| JP | 11267861 A | 10/1999 | |
| JP | 2005892 A | 1/2000 | |
| JP | 2000271774 A | 10/2000 | |
| JP | 2002-087834 A | 3/2002 | |
| JP | 2003094191 A | 4/2003 | |
| JP | 2003340588 A | 12/2003 | |
| JP | 2004223586 A | 8/2004 | |
| JP | 2004337902 A | 12/2004 | |
| JP | 200521964 A | 1/2005 | |

(56) References Cited

FOREIGN PATENT DOCUMENTS

| | | | |
|---|---|---|---|
| JP | 2005066629 A | 3/2005 | |
| JP | 2002205180 A | 4/2005 | |
| JP | 2005109322 A | 4/2005 | |
| JP | 2005268752 A | 9/2005 | |
| JP | 2005288503 A | 10/2005 | |
| JP | 2006007619 A | 1/2006 | |
| JP | 200668762 A | 3/2006 | |
| JP | 2006061954 A | 3/2006 | |
| JP | 2006150385 A | 6/2006 | |
| JP | 2006159747 A | 6/2006 | |
| JP | 2006175487 A | 7/2006 | |
| JP | 2006305586 A | 11/2006 | |
| JP | 2006525874 A | 11/2006 | |
| JP | 2007190587 A | 8/2007 | |
| JP | 2007260773 A | 10/2007 | |
| JP | 2007530292 A | 11/2007 | |
| JP | 2007319881 A | 12/2007 | |
| JP | 200800692 A | 1/2008 | |
| KR | 10-2001-0112949 A | 12/2001 | |
| KR | 10-2006-0113454 A | 11/2006 | |
| KR | 10-2006-0126799 A | 12/2006 | |
| WO | 00/64623 A1 | 11/2000 | |
| WO | 03072521 A2 | 9/2003 | |
| WO | 2004028731 A1 | 4/2004 | |
| WO | 2004-083133 A3 | 9/2004 | |
| WO | 2004105995 A1 | 12/2004 | |
| WO | 2005007335 A1 | 1/2005 | |
| WO | 2005099957 A2 | 10/2005 | |
| WO | 28035770 A1 | 3/2008 | |

OTHER PUBLICATIONS

F. Ahmed et al., "Display glass cutting by femtosecond laser induced single shot periodic void array", Applied Physics A, 2008, pp. 189-192, 93.

H.J. Herfurth et al., "Joining Challenges in the Packaging of BioMEMS," Proceedings of ICALEO, 2004.

V.A. Kagan et al., "Advantages of Clearweld Technology for Polyamides," Proceedings ICALEO, 2002.

T. Klotzbuecher et al., "Microclear—A Novel Method for Diode Laser Welding of Transparent Micro Structured Polymer Chips," Proceedings of ICALEO, 2004.

M. Sarkar et al., "Theoretical Analysis of Focusing and Intensity Mechanisms for a Spot Bonding Process Using Femtosecond Laser," IMECE2003-41906; 2003 ASME International Mechanical Engineering Congress, Nov. 2003, Washington, D.C., USA.

K. Sheetz et al., "Advancing multifocal nonlinear microscopy: development and application of a novel multibeam Yb:KGd(WO$_4$)$_2$ oscillator", Kraig Sheetz, E. Hoover, R. Carriles, D. Kleinfeld J. Squier, Oct. 2008, pp. 17574-17584, Optics Express vol. 16, No. 22.

Tamaki et al. "Welding of Transparent Materials Using Femtosecond Laser Pulses", Japanese Journal of Applied Physics, 2005, vol. 44, No. 22.

Val Kagan, et al, "Advantages of Clearweld Technology for Polyamides", Proceedings ICALEO Oct. 17, 2002; paper #1404.

Schaffer et al, "Bulk Heating of Transparent Materials Using a High-Repetition Rate Femtosecond Laser", Applied Physics A vol. 76, pp. 351-354, Dec. 2003.

P. Herman et al., "Laser micromachining of 'transparent' fused silica with 1-ps pulses and pulse trains", SPIE Vo. 3616, 0277-786X/99, Jan. 1999.

Chinese Office Action, issued Aug. 27, 2013, Patent Application No. 200980108013.8.

Notice of Reason for Refusal dated Mar. 28, 2013, JP2006-241654.

Notice of Reason for Refusal dated Jun. 17, 2013, JP2010-549872.

Korean Office Action (Notice of Preliminary Rejection); Feb. 10, 2015; Application No. 10-2010-7019975.

Japanese Office Action, issued Jul. 10, 2014, Patent Application No. 2013-191702.

Japanese Office Action, issued Mar. 4, 2014, Patent Application No. JP 2010-549872.

Response to Office Action, filed Jun. 2, 2014; Japanese Office Action issued Mar. 4, 2014.

* cited by examiner

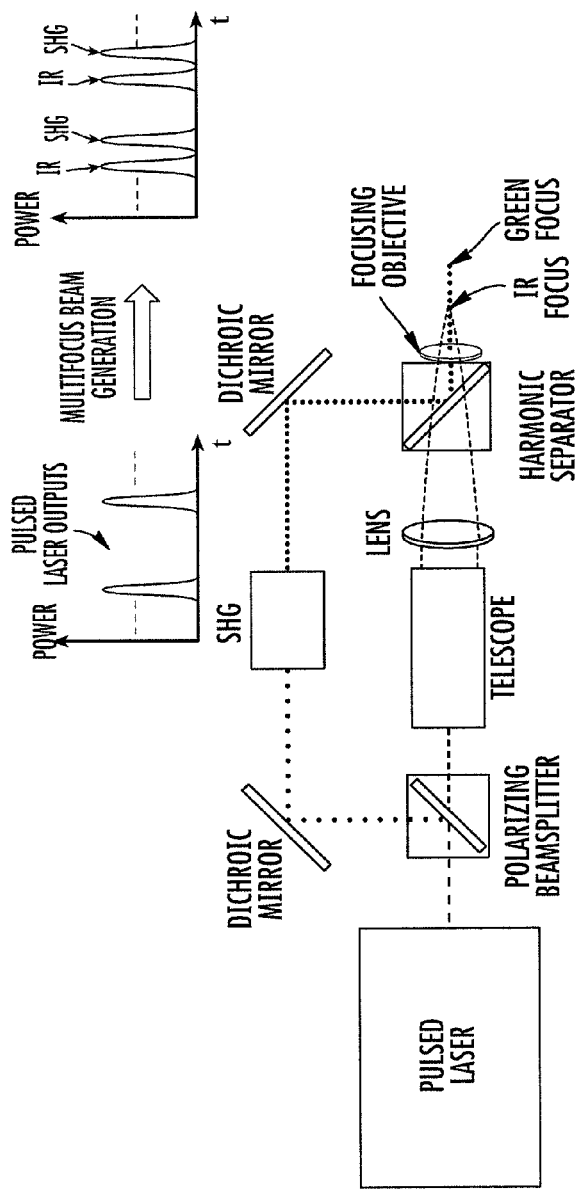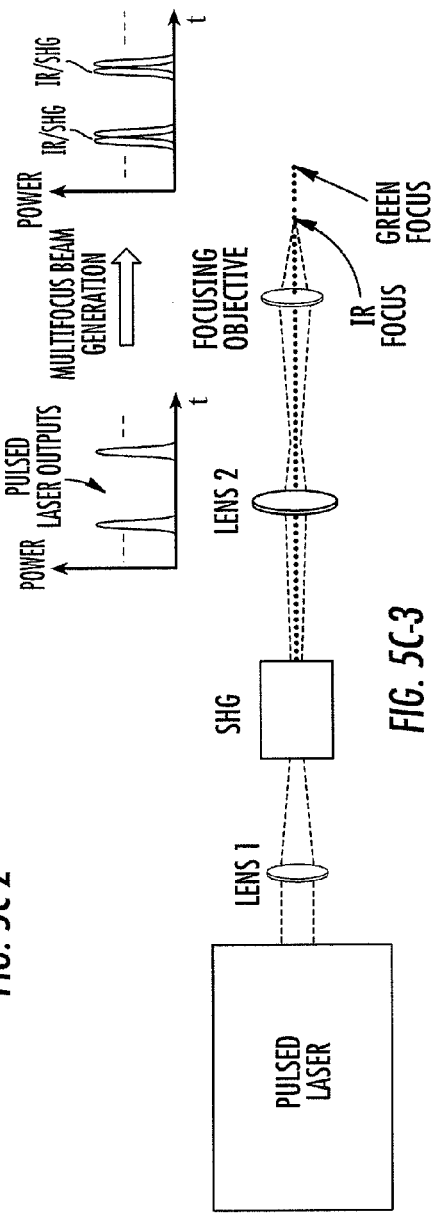
FIG. 5C-2
FIG. 5C-3

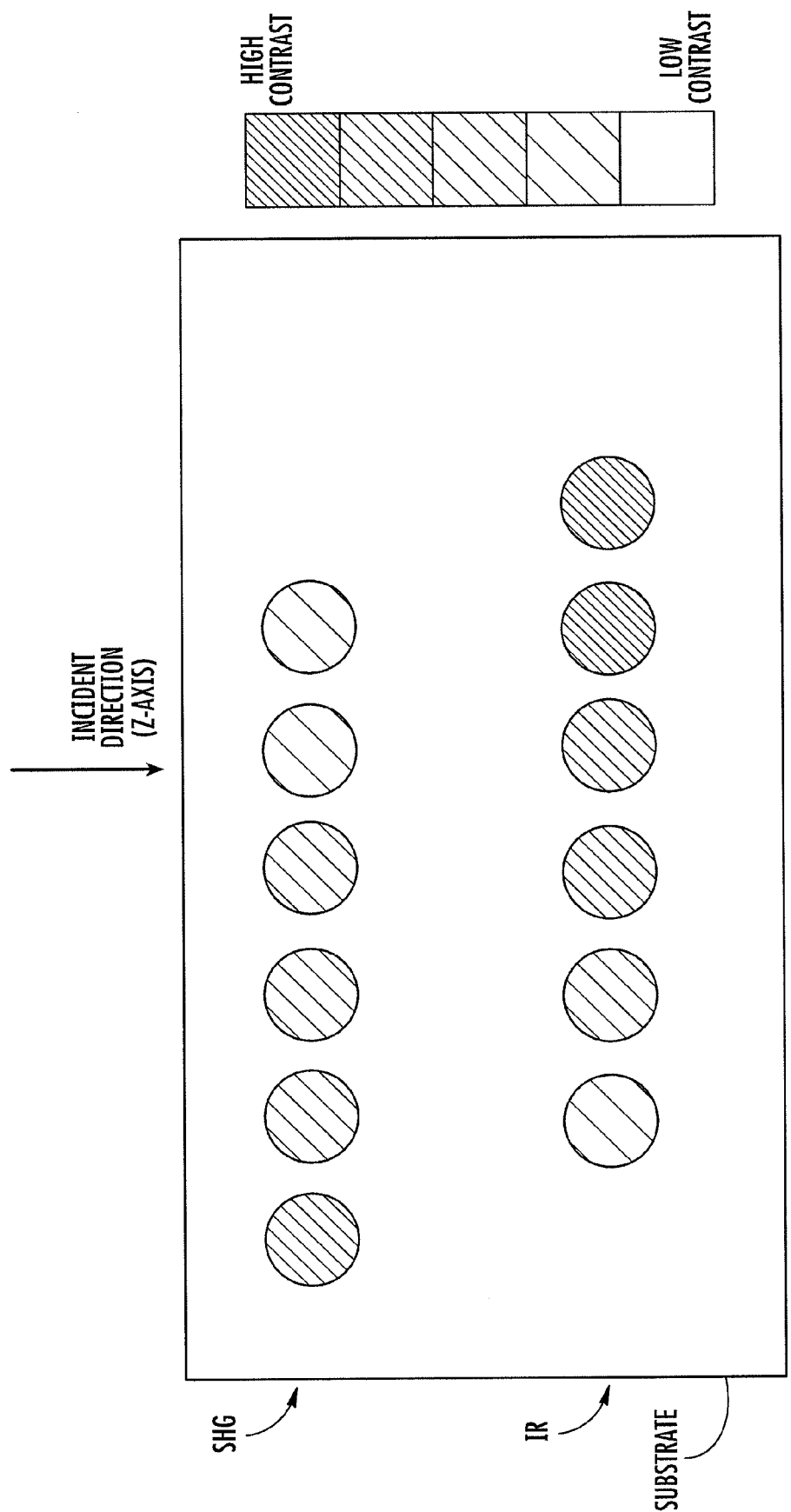

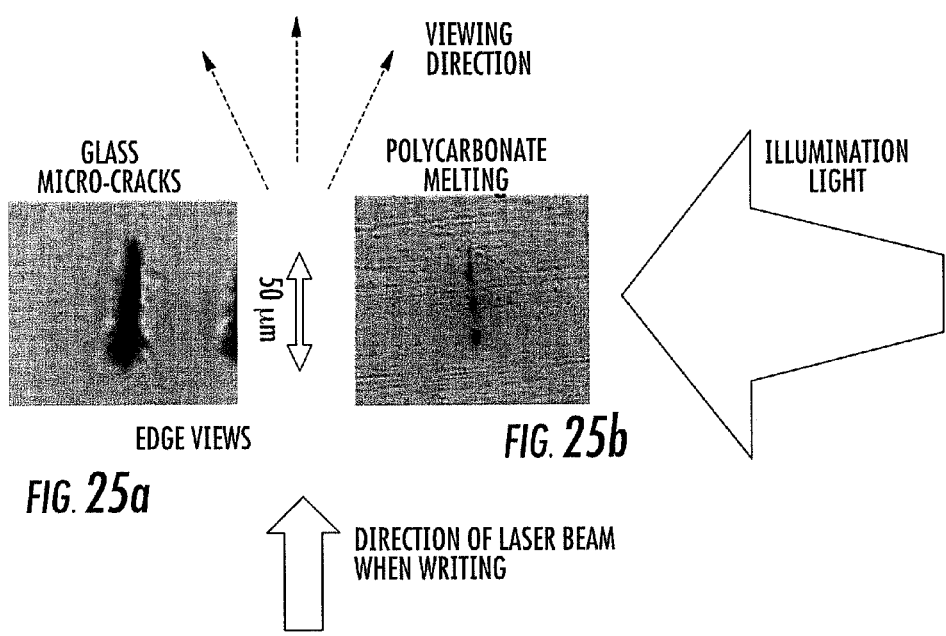

TRANSPARENT MATERIAL PROCESSING WITH AN ULTRASHORT PULSE LASER

CROSS REFERENCE TO RELATED APPLICATIONS

This application claims priority to U.S. Ser. No. 61/064, 476, filed Mar. 7, 2008, entitled "Transparent material processing with an ultrashort pulse laser". This application claims priority to U.S. Ser. No. 61/146, 536, filed Jan. 22, 2009, entitled "Transparent material processing with an ultrashort pulse laser". The disclosures of Ser. No. 61/064, 476 and Ser. No. 61/146,536 are hereby incorporated by reference in their entirety. This application is related to U.S. Ser. No. 11/517,325, entitled "Transparent material processing with an ultrashort pulse laser", filed Sep. 8, 2006, which claims priority to U.S. Ser. No. 60/714,863 filed Sep. 8, 2005. The disclosures of both Ser. No. 11/517,325 and Ser. No. 60/714,863 are hereby incorporated by reference in their entirety. The disclosure of Ser. No. 11/517,325 is published as U.S. patent application publication, Pub. No. 20070051706, published Mar. 8, 2007. The above applications are assigned to the assignee of the present invention.

BACKGROUND OF THE INVENTION

1. Field of the Invention

This invention relates to ultrashort pulse laser processing of optically transparent materials, including material scribing, welding and marking.

2. Description of the Related Art

A. Cutting and Scribing

Cutting of optically transparent materials is often done with mechanical methods. Perhaps the most common method for cutting thin, flat materials is using a mechanical dicing saw. This is the standard method in the microelectronics industry for dicing silicon wafers. However, this method generates significant debris that must be managed in order to avoid parts contamination, resulting in increased overall cost of the process. In addition, the thinner wafers being used for advanced microprocessor designs tend to shatter when cut with a dicing saw.

To address these problems, current state-of-the-art processes for "scribe and cleave" material cutting use various types of lasers to scribe a surface groove on the material prior to breaking the material along this scribe. For example, sub-picosecond laser pulses have been used to cut silicon and other semiconductor materials (H. Sawada, "Substrate cutting method," U.S. Pat. No. 6,770,544). Also, a focused astigmatic laser beam has been used to make a single surface groove for material cutting (J. P. Sercel, "System and method for cutting using a variable astigmatic focal beam spot," U.S. Patent Application No. 20040228004). This patent claims that by optimizing the astigmatic focusing geometry, increased processing speeds can be achieved.

To achieve a precise, high quality cleave, the groove must be of a certain minimum depth, the value of which varies by application (for example, 100-μm thick sapphire requires an approximately 15-μm deep groove for acceptable cleaving). Because the depth of the groove decreases as the scanning speed increases, the minimum depth requirement limits the maximum scanning speed, and hence the overall throughput, of a laser-scribing system. Alternative technology for material cutting uses multiphoton absorption to form a single laser-modified line feature within the bulk of a transparent target material (F. Fukuyo et al., "Laser processing method and laser processing apparatus," U.S. Patent Application No. 20050173387). As in the case of a surface groove, there is a particular minimum size of this sub-surface feature that is required in order to yield precise, high quality cleaving of the material, which equates to a limit on the processing speed for material cutting.

A noteworthy application of "scribe and cleave" material cutting is wafer dicing for separation of individual electronic and/or optoelectronic devices. For example, sapphire wafer dicing is used in singulation of blue light emitting diodes. Wafer singulation can be accomplished with backside laser ablation, minimizing contamination of devices on the front side of the wafer (T. P. Glenn et al., "Method of singulation using laser cutting," U.S. Pat. No. 6,399,463). Also, an assist gas can be used to aid a laser beam that dices a substrate (K. Imoto et al., "Method and apparatus for dicing a substrate," U.S. Pat. No. 5,916,460). In addition, a wafer can be diced by first using a laser to scribe a surface groove, and then using a mechanical saw blade to complete the cutting (N. C. Peng et al., "Wafer dicing device and method," U.S. Pat. No. 6,737, 606). Such applications are generally executed in large volume and hence processing speed is of particular importance.

One process uses two different types of lasers, one of which scribes the material, and the other of which breaks the material (J. J. Xuan et al., "Combined laser-scribing and laser-breaking for shaping of brittle substrates," U.S. Pat. No. 6,744,009). A similar process uses a first laser beam to generate a surface scribe line, and a second laser beam to crack a non-metallic material into separate pieces (D. Choo et al., "Method and apparatus for cutting a non-metallic substrate using a laser beam," U.S. Pat. No. 6,653,210). Two different laser beams for scribing and cracking have also been used to cut a glass plate (K. You, "Apparatus for cutting glass plate," International Patent Application No. WO 2004083133). Finally, a single laser beam has been used to scribe and crack a material by focusing the laser beam near the top surface of the material and moving the focus down through the material to near the bottom surface while providing relative lateral motion between the focused laser beam and the target material (J. J. Xuan et al., "Method for laser-scribing brittle substrates and apparatus therefor," U.S. Pat. No. 6,787,732).

B. Material Joining

The joining of two or more optically transparent materials, such as glasses and plastics, is useful for applications in various industries. The construction of any type of device in which optical transparency allows or supplements functionality, or otherwise results in additional value (e.g. aesthetic), could benefit from such a joining process. One example is hermetic sealing of components where visual inspection is needed (e.g. telecommunications and biomedical industries).

In some applications, conventional joining processes (e.g. adhesives, mechanical joining) are inadequate. For example, many adhesives might prove non-biocompatible in the case of biomedical implant devices. For other devices, the adhesion simply may not be strong enough for the particular application (e.g. high-pressure seals). For such demands, laser welding offers an ideal solution.

In microfluidic systems, the sealing of individual, closely spaced paths relative to each other with a cap piece that covers the entire device would be desirable. Strong, tightly sealing joints can be difficult to make with other methods due to the small contact region between the different microfluidic paths. Laser welding can precisely position the bonded regions between these microfluidic paths and provide a tight seal.

The current state-of-the-art technology for laser welding of transparent materials consists of:

(1) use of a $CO_2$ laser, the wavelength (~10 μm) of which is linearly absorbed by many optically-transparent materials, or (2) introduction of an additional material at the interface of the transparent materials, which is specially designed to absorb the laser radiation, thereby causing heating, melting, and fusing of the materials.

Both of these methods are limited in their functionality and/or costly in their implementation.

A pulsed $CO_2$ slab laser has been used to weld Pyrex to Pyrex, and to bond polyimide and polyurethane to titanium and stainless steel (H. J. Herfurth et al., "Joining Challenges in the Packaging of BioMEMS," Proceedings of ICALEO 2004). Also, fused quartz and other refractory materials have been welded with a 10.6 μm $CO_2$ laser (M. S. Piltch et al., "Laser welding of fused quartz," U.S. Pat. No. 6,576,863). The use of such $CO_2$ lasers does not allow welding by focusing the beam through a thick top layer material, since the laser radiation is absorbed before it can reach the interface. An additional disadvantage is that the large wavelength does not allow focusing the beam to a small spot, thereby limiting its usefulness for creating small weld features on micron scales.

Alternatively an absorbing layer that is transparent to the human eye can be placed between two materials to be welded, such as polyamide and acrylic (V. A. Kagan et al., "Advantages of Clearweld Technology for Polyamides," Proceedings ICALEO 2002). A diode laser with line focusing is then used for welding (T. Klotzbuecher et al., "Microclear—A Novel Method for Diode Laser Welding of Transparent Micro Structured Polymer Chips," Proceedings of ICALEO 2004). The dye layer is specially designed to absorb the laser's wavelength (R. A. Sallavanti et al., "Visibly transparent dyes for through-transmission laser welding," U.S. Pat. No. 6,656, 315).

One welding process for bonding glass to glass or metal employs a laser beam to melt a glass solder between the surfaces to be welded (M. Klockhaus et al., "Method for welding the surfaces of materials," U.S. Pat. No. 6,501,044). Also, two fibers can be welded together by using an intermediary layer that is linearly absorbent to the laser wavelength (M. K. Goldstein, "Photon welding optical fiber with ultra violet (UV) and visible source," U.S. Pat. No. 6,663,297). Similarly, a fiber with a plastic jacket can be laser-welded to a plastic ferrule by inserting an absorbing intermediary layer (K. M. Pregitzer, "Method of attaching a fiber optic connector," U.S. Pat. No. 6,804,439).

The use of an additional layer of an absorbing material has significant drawbacks. The most obvious is the cost of purchasing or fabricating a material that is appropriate for the process. A potentially more costly issue is the increase in processing time associated with incorporating this additional material into the manufacturing process. Such costs would be expected to rise dramatically as the size of the desired weld region becomes increasingly small, as would be the case with biomedical implant devices. Another disadvantage of using an intermediate, light-absorbing layer is that this layer may introduce contaminants into the area to be sealed. In the case of a microfluidic system, the light-absorbing layer would be in direct contact with the fluid flowing through the channel.

One method for welding a transparent material to an absorbing material is called through-transmission welding. In this method a laser beam is focused through a transparent material and onto an absorbing material, resulting in welding of the two materials (W. P. Barnes, "Low expansion laser welding arrangement," U.S. Pat. No. 4,424,435). This method has been used to weld plastics by directing polychromatic radiation through a top transparent layer and focusing the radiation onto a bottom absorbing layer (R. A. Grimm, "Plastic joining method," U.S. Pat. No. 5,840,147; R. A. Grimm, "Joining method," U.S. Pat. No. 5,843,265). In another example of this method, a black molded material that is transparent to the laser wavelength is welded to an adjacent material or via an added welding assist material that absorbs the laser wavelength (F. Reil, "Thermoplastic molding composition and its use for laser welding," U.S. Pat. No. 6,759,458). Similarly, another method uses at least two diode lasers in conjunction with a projection mask to weld two materials, at least one of which is absorbent of the laser wavelength (J. Chen et al., "Method and a device for heating at least two elements by means of laser beams of high energy density," U.S. Pat. No. 6,417,481).

Another laser welding method performs successive scans of a laser beam over the interface between two materials to incrementally heat the materials until melting and welding occurs (J. Korte, "Method and apparatus for welding," U.S. Pat. No. 6,444,946). In this patent one material is transparent, while the other material is absorbent to the laser wavelength. Finally, one method uses ultraviolet, laser, X-ray, and synchrotron radiation to melt two pieces of material, and then brings them into contact in order to form a weld (A. Neyer et al., "Method for linking two plastic work pieces without using foreign matter," U.S. Pat. No. 6,838,156).

Laser welding is disclosed for hermetic sealing of organic light emitting diodes where there is at least one layer of organic material between two substrates ("Method of fabrication of hermitically sealed glass package", U.S. Patent Application Publication 20050199599).

Tamaki et al. discuss the use of 130-fs laser pulses at 1 kHz to bond transparent material in "Welding of Transparent Materials Using Femtosecond Laser Pulses", Japanese Journal of Applied Physics, Vol. 44, No. 22, 2005. However, the material interaction of low repetition rate ultrashort pulses (kHz) is known to be distinctly different compared to high repetition rate ultrashort pulses (MHz) due to electron-phonon coupling time constants and accumulation effects.

C. Sub-Surface Marking

The patterning of sub-surface marks in glass has been adapted by artists to create 2-D portraits and 3-D sculptural works. These marks are designed to be strongly visible under a wide range of conditions without requiring external illumination.

Tightly focusing energy below the surface of optically transparent materials can produce visible, radially propagating micro-cracks. Long-pulse lasers are commonly used to create these marks. Several patents discuss variation of the size and density of these radial cracks to control the visibility of the subsequent pattern (U.S. Pat. Nos. 6,333,486, 6,734, 389, 6,509,548, 7,060,933).

The visibility of the mark can be controlled by the crack density around the central laser spot, rather than just the size of the mark (U.S. Pat. No. 6,417,485, "Method and laser system controlling breakdown process development and space structure of laser radiation for production of high quality laser-induced damage images").

U.S. Pat. No. 6,426,480 ("Method and laser system for production of high quality single-layer laser-induced damage portraits inside transparent material") uses a single layer of smooth marks where brightness is controlled by the spot density.

Increasing the pulse duration of the writing laser light will increase the brightness of the mark (U.S. Pat. No. 6,720,521, "A method for generating an area of laser-induced damage inside a transparent material by controlling a special structure of a laser irradiation").

SUMMARY OF THE INVENTION

Through nonlinear absorption, ultrashort laser pulses can deposit energy into an extremely well-defined region within the bulk of a transparent material. Matching the laser properties and processing conditions can produce a range of features, changes in the index of refraction that enable optical waveguiding, melting and subsequent bonding at an internal interface, or the formation of an optical defect that scatters light.

The high repetition rate of the laser and significant pulse-to-pulse overlap results in an additional interaction between the material modification created by the previous laser exposure and the subsequent pulses in the same region. The light diffracts around the pre-existing modification and, through constructive interference, creates another spot in the "shadow" of the previous modification, commonly known as the "spot of Arago" or the "Poisson spot". The size and intensity of the spot increases with distance, with the intensity asymptotically approaching the input laser intensity.

One object of this invention is to enable clean breaking of transparent materials at a higher speed compared to the conventional technique. This is achieved by using ultrashort laser pulses to create both a surface groove on the material and one or more laser-modified regions within the bulk of the material (or, alternatively, multiple sub-surface laser-modified features only), with only a single pass of the beam across the material. Because multiple scribe features are created simultaneously, located both on the surface and in the bulk of the material, or in the bulk of the material only, the success of the subsequent cleave is not necessarily dependent on surface groove depth.

During the cleaving process of a scribed material, the fracture begins at the surface scribe feature and propagates down through the material. If the surface groove is too shallow, the fracture will tend to wander, resulting in low quality cleave facets and poor cleave process precision. With the presence of additional scribe feature(s) within the bulk of the material, however, the fracture is guided through the material in the desired direction, resulting in higher cleaving precision and facet quality than would be expected for the case of a shallow surface scribe only.

If a sufficient portion of the bulk material is modified below the surface, the fracture can begin from a sub-surface modified region and propagate to adjacent modified regions through the bulk of the material, without the need of a surface scribe line. Minimizing the size of, or completely eliminating, the surface groove also reduces the debris produced by the process that can contaminate the processing environment or require more extensive post-process cleaning.

Another object of this invention is the generation of patterns of sub-surface defects in transparent materials by focusing ultrashort laser pulses below the surface. Slightly modifying the processing conditions relative to scribing can produce optical defects below the surface that scatter light. By controlling the characteristics and arrangement of these defects, these patterns can be made to be clearly visible when illuminated from the side, but difficult to see when there is no illumination. This feature of sub-surface marking can be utilized for indicator signs or lights for vehicles, warning signs or lights, or for adding value (e.g., artistically) to a simple glass, etc. This technique is distinct from known laser marking techniques which are designed in a way such that the defects produced in the material are always clearly visible.

In one embodiment of this invention, patterns of optical defects are created at different depths within the transparent material. Having the marks at different depths prevents a "shadowing" effect where one mark blocks the illuminating light from hitting subsequent marks. This structure at the same time reduces the amount of scattering from ambient illumination sources which are not directional, enhancing the contrast between the on-off states. These defects can be discrete points or extended lines.

The small size and smoother profile of these defects makes them less visible when not illuminated. Also the substrate will be stronger and less susceptible to crack propagation due to thermal or mechanical stress, particularly with thin transparent materials. The small size also allows for more discrete writing positions per unit thickness, increasing the pattern resolution for a given thickness of transparent material.

There is a trade-off between the visibility of the mark when illuminated and the invisibility of the marks without illumination. This trade-off can be adjusted by controlling the illuminating light source intensity, the size and smoothness of the marks and the spacing between marks. The control parameters for the size of the marks include pulse duration, fluence, and repetition rate and wavelength of the laser, and depth and movement speed of the focus point within the material. It is important to note that these parameters need to be adjusted for transparent materials with different optical, thermal and mechanical properties.

Visibility is assessed over a viewing direction, for example within a solid angle in which scattered illumination is received. Visibility, as referred to herein, is not constrained to detection of visible wavelengths and viewing with the unaided eye. Embodiments of the present invention are generally applicable for detection of radiation along a detection direction, and with suitable irradiation of features within the transparent material. A non-visible source having a wavelength within the range of material transparency may be used. A detector responsive at this wavelength would then be used.

The desired pattern can be made up of a collection of discrete pixels where each pixel is a collection of parallel lines or other geometric shapes. Utilizing pixels enables creation of an over-all larger icon with fewer lines with greater contrast in visibilities.

The sub-surface pattern can be illuminated by a properly focused light source. Focusing is important to efficiently illuminate the pattern and minimize stray light. This illuminating light can be delivered directly from the light source if the distance between the light source and the pattern is relatively short. If the distance is long, total internal reflection between the top and bottom surfaces of the transparent material can be used to guide the light.

Another alternative is to create optical waveguides in the transparent material to deliver the light. An advantage of optical waveguide delivery is that the path between the source and the pattern need not be straight and/or short. For optical waveguide delivery, the output end of the waveguide should be properly designed to illuminate the desired pattern.

Two patterns in the same region can be distinguished separately and controllably illuminated by two different light sources. The axis of the illumination source for the respective pattern is perpendicular to the marks which make up the pattern. In this way the maximum scattering (and maximum visibility) from a particular illumination source can be selected for only the designated pattern.

In at least one embodiment, laser-based material modification produces features on or within a substantially transparent material other than glass. For example, plastics, transparent polymers, and similar materials have some desirable characteristics. Some desirable material properties include: decreased weight (about 4-fold relative to glass), flexibility which provides for bending of a substrate to form various shapes, decreased thickness which provides capability for increasing brightness with fixed edge illumination, and increased material strength with reduced susceptibility to shattering.

The fluence for processing transparent polymers (polycarbonate, PMMA (polymethylmethacrylate), etc.) is less than that for glasses. In some embodiments, laser parameters, for example pulse width, repetition rate, and pulse energy, may overlap with suitable parameter values for glass processing. However certain materials, particularly polycarbonate, may be processed with much lower energy and shorter pulse widths. The features formed may therefore be more controlled. The density of features formable within the volume may increase.

Thin portions of polycarbonate or similar materials also facilitate forming switchable elements in a single design. Furthermore, features formed within the material may generally reduce any susceptibility to any undesirable microcracking or other unwanted changes within the depth of the material.

In some embodiments switchable or addressable icons may be formed. As noted in the discussion above related to generation of patterns of sub-surface defects in transparent materials, various tradeoffs can be made to improve the visibility. The patterns may be arranged laterally or at different depths and viewed or illuminated at various angles, including non-orthogonal illumination and viewing conditions. One or more controlled illumination sources may directly illuminate features to be viewed. In some embodiments, an internal waveguide or a light guide may deliver energy to a feature. It is generally desirable to provide high contrast when illuminating from a desired direction, with low levels or indiscernible levels of glare between elements preventing loss of contrast caused by crosstalk (e.g., veiling glare) or any phenomena that produces unwanted radiation within a detection angle.

Another object of this invention is to enable bonding of two pieces of clear material using a high repetition rate femtosecond pulse laser with no supplemental bonding agent. Focusing a high repetition rate, ultrafast laser beam at the contact area of two transparent material pieces will create a bond by localized heating. The required repetition rate for sufficient heat accumulation depends on many different process variables, including pulse energy, beam focusing geometry, and the physical properties of the particular material(s) to be welded. A theoretical analysis of conditions affecting the femtosecond laser spot bonding process emphasizes the determination of optimal focusing conditions for the process (M. Sarkar et al., "Theoretical Analysis of Focusing and Intensity Mechanisms for a Spot Bonding Process Using Femtosecond Laser," IMECE2003-41906; 2003 ASME International Mechanical Engineering Congress, November 2003, Washington, D.C., USA).

Due to nonlinear absorption of the laser radiation (caused by the ultrashort pulse duration), and the pulse-to-pulse accumulation of heat within the materials (caused by the high repetition rate), welding of transparent materials can be achieved with a degree of simplicity, flexibility, and effectiveness that is unparalleled in existing alternative methods. The nonlinear absorption process allows for concentration of the absorbed energy near the weld interface, which minimizes damage, and therefore optical distortion, to the rest of the material. Fine weld lines are possible when dense channels need to be separated.

Further, an embodiment of the current invention enables the joining by laser of two materials that are transparent to the wavelength of the laser radiation by directing the focal region of a beam of high-repetition rate, ultrashort pulses near the interface of the materials to be joined. The laser pulse repetition rate is between about 10 kHz and 50 MHz and the laser pulse duration is between about 50 fs and 500 ps. The laser pulse energy and beam focusing optics are chosen so as to generate an energy fluence (energy per unit area) of more than about 0.01 J/cm$^2$ at the region to be welded.

The optimal range of fluence for welding depends on the particular materials to be welded. For transparent polymers (polycarbonate, PMMA (polymethylmethacrylate), etc.), the required fluence is less than that for glasses. This is due to the widely different physical properties of the materials. For example, the melting temperature of PMMA is ~150 degrees Celsius, while that for fused silica is ~1585 degrees Celsius. Therefore, significantly more laser fluence is required to melt fused silica. Other important material properties include the heat capacity and the thermal conductivity. The range of fluence for welding of polymers is between about 0.01 and 10.0 J/cm$^2$, while the corresponding range for welding glasses is between about 1.0 and 100 J/cm$^2$.

In general, welding requires that the two surfaces to be joined have virtually no gap between them. An object of this invention is the formation of a raised ridge at the interface between the two pieces to be bonded, that bridges any gap between them. By focusing high repetition rate fs pulses slightly below the surface, heating, melting, and pressure can result in localized raising of the surface of the glass. These bumps are 10's of nm to a few µm high. Where the energy deposited is not sufficient to cause the raised ridge to bond to the mating piece, a second pass of the laser at a slightly higher focus position will then weld the ridge to the mating piece. If a single ridge is not tall enough to bridge the gap, a second ridge on the upper mating surface can be created.

In addition, welding of materials with varying degrees of linear absorption can be achieved with this invention. While this invention uses nonlinear absorption phenomena as the primary means to couple energy to the material, it is appreciated that materials exhibiting some amount of linear absorption of the irradiating laser pulses can also be welded using methods presented herein. The significant aspect of linear absorption as it relates to this invention is that for higher linear absorption, the thickness of the material through which the beam can be focused decreases. Furthermore, higher linear absorption decreases the degree of localization of the weld feature.

The spatial distribution of the laser fluence can also affect the weld quality. While typical laser processing involves focusing a Gaussian laser beam to produce a smaller Gaussian laser beam, novel beam-shaping methods may be used in order to improve upon the quality and/or efficiency of a particular welding process. For example, transforming the typical Gaussian fluence distribution into a spatially uniform fluence distribution (known as a "flat-top" or "top-hat" intensity distribution) may result in more uniform weld features.

The ultrashort nature of the pulses allows for coupling of the laser energy into the transparent material via nonlinear absorption processes; however, this alone does not allow for laser welding, as this process does not generally result in heating of the material. It is the additional aspect of a high pulse repetition rate, combined with a particular range of other processing conditions, that allows for accumulation of heat within the materials so that melting, and subsequent cooling and joining, of the materials can be achieved.

Due to the absence of a supplemental bonding agent, processing time and expense are reduced, contamination inside the device due to excess bonding agent is eliminated, and fine dimensional tolerances can be maintained. Bond points and lines can be very close to other features without causing any interference. Also, very limited thermal distortion of material adjacent to the weld area is possible due to the concentrated fluence at the focal volume and the nonlinear absorption process.

In at least one embodiment multiple laser beams are rapidly generated and focused at different depths to modify a target material.

In at least one embodiment the focused beams are collinear and propagate along a common direction to respective focal points at or near a surface of the material, or within the material. A system may be configured in such a way that multiple beams are generated simultaneously, within a predetermined time interval, or any suitable combination thereof.

In at least one embodiment the focused beams may comprise different wavelengths, each wavelength beyond an absorption edge of the material, such that the target material is highly transmissive at the wavelengths.

In at least one embodiment short pulse widths, for example in the femtosecond (fs) to picosecond (ps) range, provide for control of any temporal overlap between pulses, and for a compact system configuration.

Various embodiments improve processing speed relative to that obtainable with a single beam and multiple processing passes with different beam focal positions, and may improve material processing results.

BRIEF DESCRIPTION OF THE DRAWINGS

The invention will be more clearly understood from the following description in conjunction with the accompanying drawings, wherein:

FIG. 17 is an illustration wherein the substrate is not orthogonal to the viewing direction, but the direction of the writing laser was orthogonal to the substrate.

FIG. 18 is an illustration wherein the substrate is non-orthogonal to the illumination and viewing directions and the direction of the writing laser beam is parallel to the viewing direction.

FIGS. 21-23 are photos of a glass marked sample made according to the present invention; and.

FIGS. 25a and 25b show microscope images of respective cross sections obtained from glass and polycarbonate samples, oriented similarly to the schematic shown in FIG. 11.

DETAILED DESCRIPTION OF THE PREFERRED EMBODIMENTS

1. Ultrashort Pulse Laser Scribing

Figure 5A:
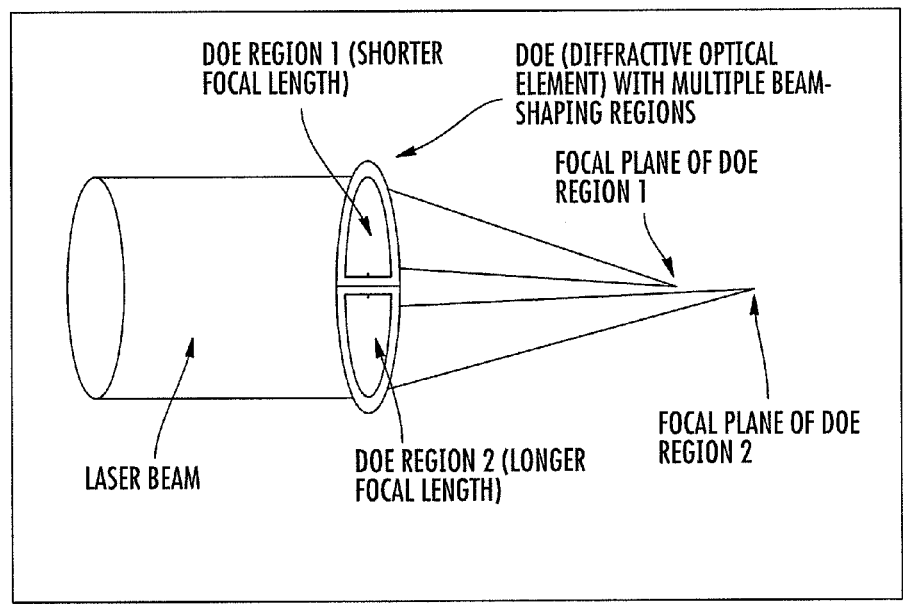
FIG. 5a is an illustration of a diffractive optical element (DOE) configured to simultaneously generate multiple focused spots.
Figure 5:
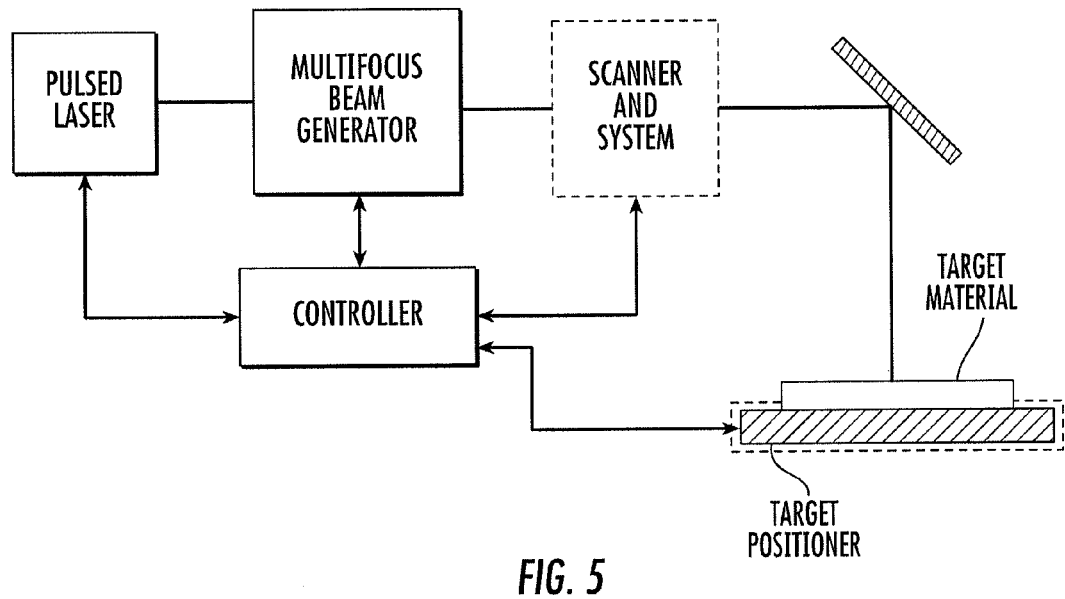
FIG. 5 schematically illustrates a system configured to form multiple focused beams having beam waists spaced depthwise relative to a target material.
Figures 1, 2, 5B:
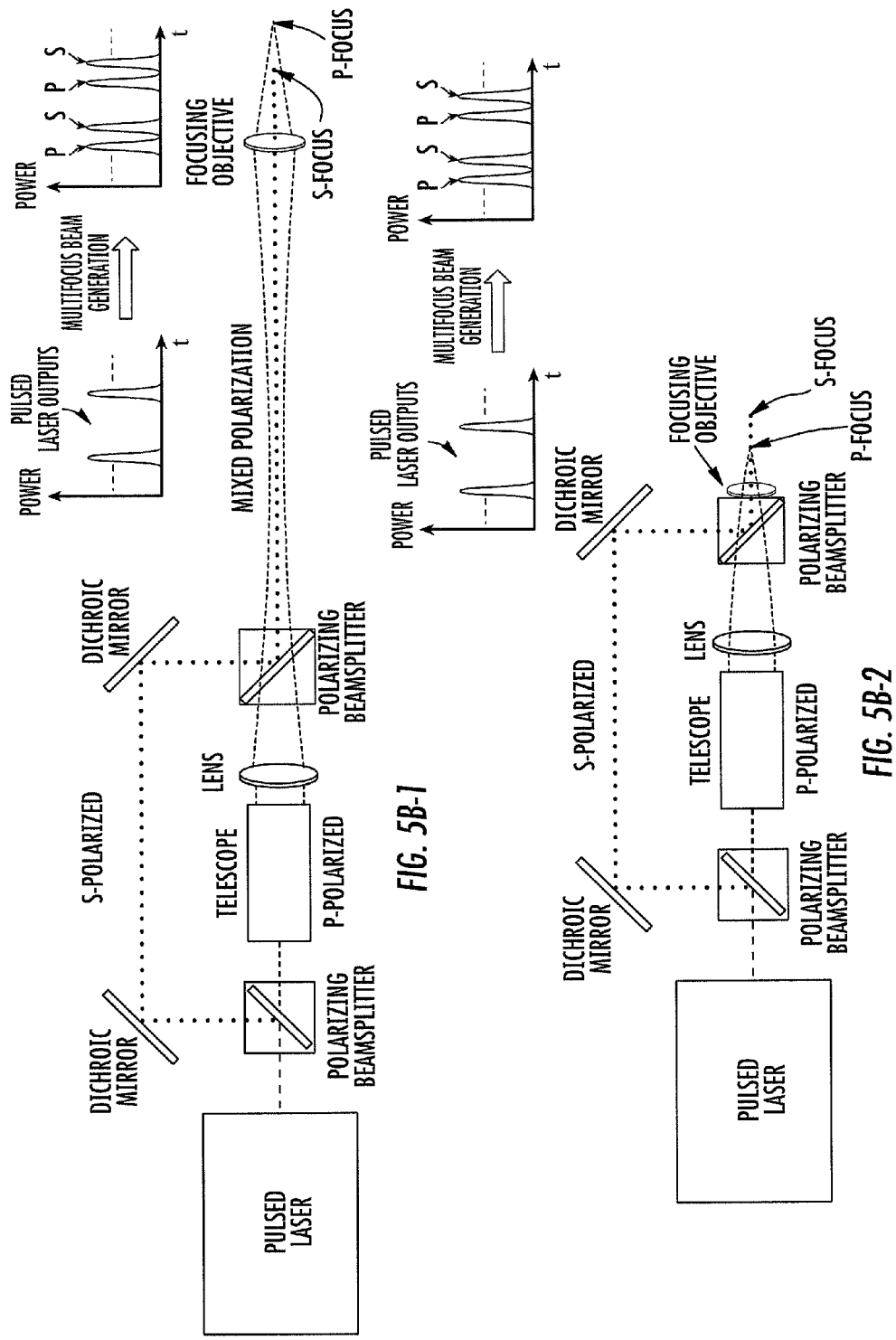
FIGS. 5b-5c schematically illustrate various configurations for rapidly forming collinear, multiple focused beams.
Figures 3, 5B:
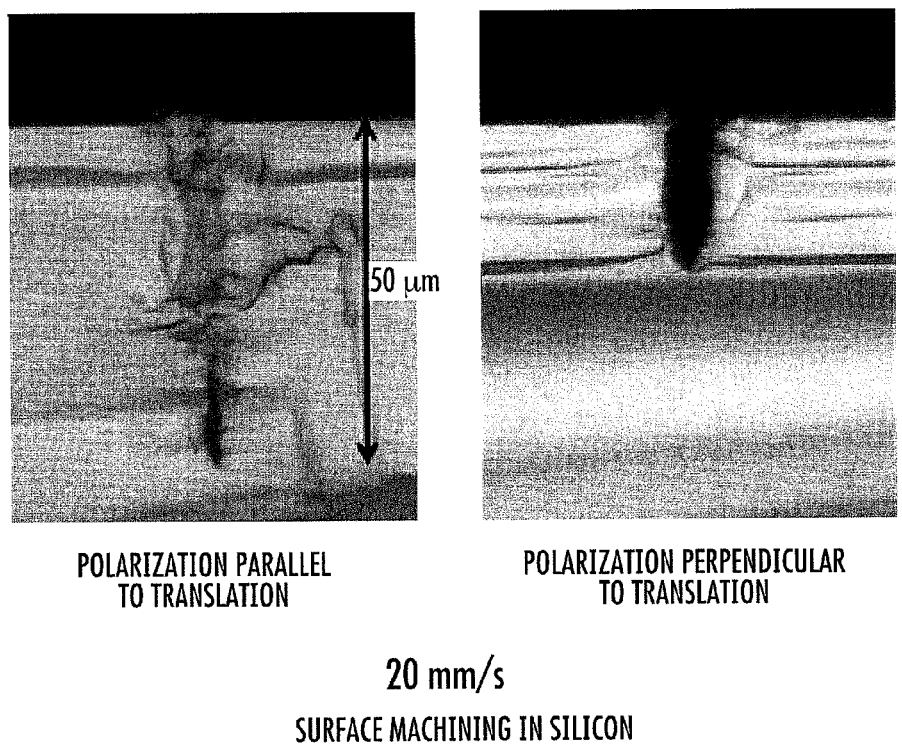

FIG. 1 illustrates one embodiment of the current invention, which is a method for scribing transparent materials for subsequent cleaving. This embodiment employs a laser system (1) producing a beam of ultrashort laser pulses (2), an optical system (6) that generates a desired laser beam intensity distribution, and a target material (7) to be scribed that is transparent to the wavelength of the laser pulses. In addition, a Z-axis stage (8) is used for beam focus position control (depth), and an automated X-Y axis stage assembly (9) is generally required for moving the work pieces (7) laterally relative to the focused laser beam. Alternatively, the laser beam (2) could be moved relative to a stationary target material with the use of scanning mirrors (3), (4), and (5).

The laser beam (2) is directed through the optical system (6), which transforms the laser beam (2) to create a desired 3-dimensional intensity distribution. Particular regions of the transformed laser beam have sufficient intensity to cause ablation and/or modification of the target material via nonlinear absorption processes. Material ablation generally refers to the vaporization of material from intense laser radiation. Material modification more broadly refers to a change in the physical and/or chemical structure of the irradiated material, which can affect the propagation of a crack through the material. Laser modification generally requires lower optical intensities than laser ablation for a particular material.

The transformed beam is directed toward the target transparent material (7) to cause ablation/modification of the material (7) at multiple determined locations, within and/or on the surface, of the material (7). The ablated and/or modified regions are generally located in the material (7) along the optical propagation axis and are separated within the material (7) by a determined distance. The transformed beam and the target material (7) are moved relative to each other, resulting in the simultaneous generation of multiple laser-scribe features in the material (7). The multiple scribe features allow for cleaving of the material (7) with the application of suitable force(s) (See FIG. 1(b)).

Figure 2:
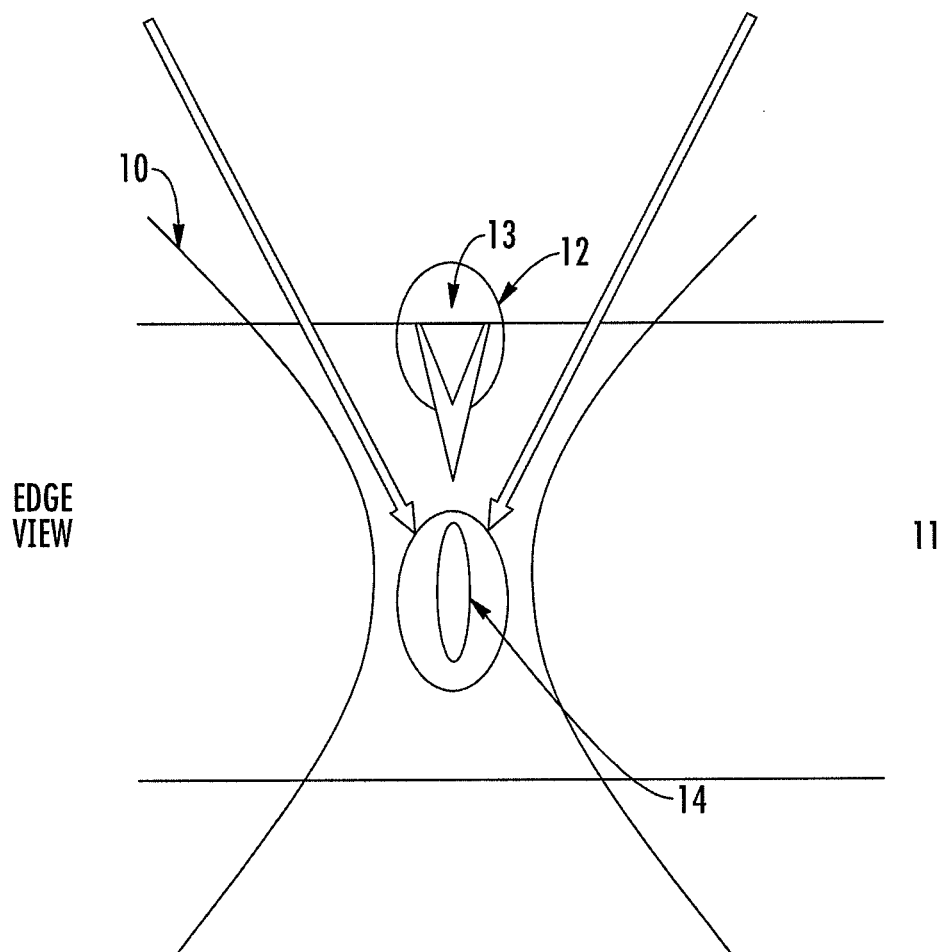
FIG. 2 is an illustration of the surface and bulk scribe features that are generated by a focused Gaussian beam according to one embodiment of the current invention.

FIG. 2 illustrates another embodiment of the current invention, in which a laser beam (10) having a Gaussian spatial intensity distribution is focused to create sufficient intensity for nonlinear absorption and subsequent ablation or modification of the target material (11). The region of tightest focus is positioned below the material's surface to a chosen location within the bulk of the material (11). In addition, by employing suitable focusing optics and laser pulse energy, a region of intensity sufficient to cause material ablation is at the same time generated on or near the surface of the material (11).

The important aspect is that the pulse energy and focusing geometry are chosen such that there is sufficient intensity to simultaneously cause ablation or modification not only within the bulk of the material (where the focused beam waist is positioned), but also at another point on the optical propagation axis prior to the beam waist (12) (either in the bulk or on the surface of the material). When the laser pulses encounter the target material (11), their high-intensity region (near the center of the radial Gaussian intensity distribution) is absorbed nonlinearly by the material and ablation or modification occurs. The outer spatial regions of the laser beam (outer edges of the Gaussian intensity distribution), however, are too low in intensity to be absorbed by the material, and continue to propagate to the beam waist, located further within the bulk of the material. At the beam waist location, the beam diameter is small enough to once again generate sufficient intensity for nonlinear absorption and subsequent laser modification to occur in the bulk of the material.

A region directly below the surface ablation may also be modified by diffraction and constructive interference of succeeding pulses after the initial surface feature is created (spot of Arago). A relatively high repetition rate laser source better enables this process at reasonable translation speeds.

Under these focusing and pulse energy conditions, translation of the material (11) relative to the laser beam (10) results in the simultaneous generation of multiple laser-modified regions (i.e. a surface groove (13) and one or more bulk modified regions (14), or two or more bulk modified regions), which together allow for precise cleaving of the material.

Figure 3:
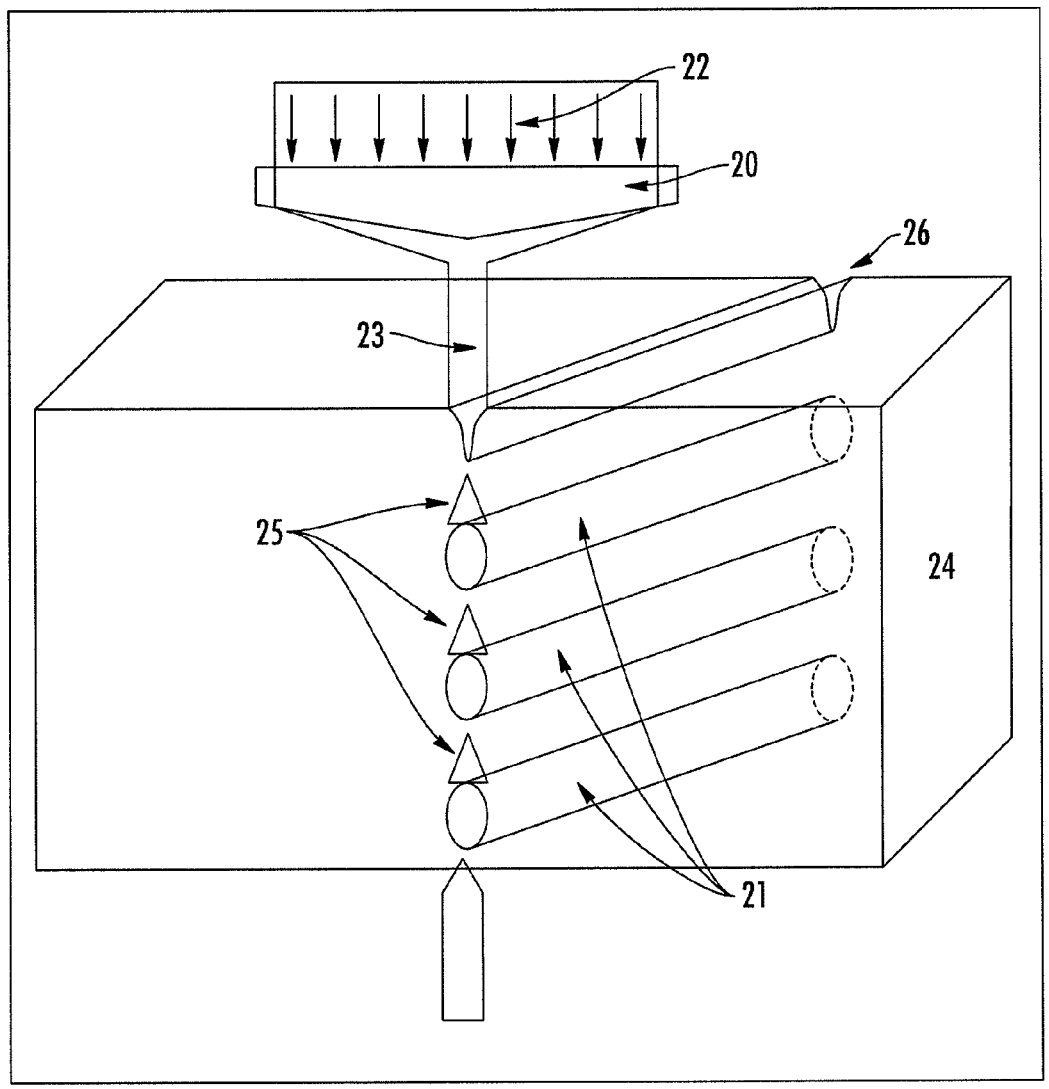
FIG. 3 is a diagram of a system that uses an axicon lens to generate multiple sub-surface scribe lines according to one embodiment of the current invention.

FIG. 3 illustrates another embodiment of the current invention, in which an axicon (cone-shaped) lens (20) is used to generate the multiple internal scribe lines (21). When illuminated with a laser beam (22), the axicon lens (20) creates what is known as a 0th-order Bessel beam. The name arises from the fact that the mathematical description of the optical intensity distribution in the plane normal to the axis of propagation is defined by the 0th-order Bessel function, with the radial position from the beam center being the independent variable. This beam has the unique property of containing a high-intensity central beam spot (23) that can propagate with the same small size for much larger distances than for the case of a similarly-sized beam spot generated by conventional focusing methods (i.e. much longer than the Rayleigh range of a conventionally-focused beam). The central intensity field is surrounded by a plurality of concentric rings of light (not shown), the intensity of which decreases with increasing radius. Due to an inward radial component of their propagation vector, these rings of light continually reconstruct the small, central beam spot (25) as the Bessel beam propagates. Therefore, a small, high intensity central beam spot (23) can be generated that maintains its small diameter through the entire thickness of a target material (24). Because of the extended range of tight beam focusing, the Bessel beam is also commonly referred to as a non-diffracting beam.

Because the outer rings reconstruct the intense center spot (23), if the center spot (23) is intense enough to cause ablation of the material at the surface (26), the rings (which have a larger diameter than the ablated region) will converge to the center of the beam a short distance later, causing reconstruction of the intense center beam spot, at which point ablation or material modification can occur again. With proper optical system design and sufficient pulse energy, this process of ablation and subsequent beam reconstruction can repeat through the entire bulk of the transparent material (24). Other optical components, such as graded-index lenses and diffractive optical elements, can also be used to generate Bessel beams.

Figure 4:
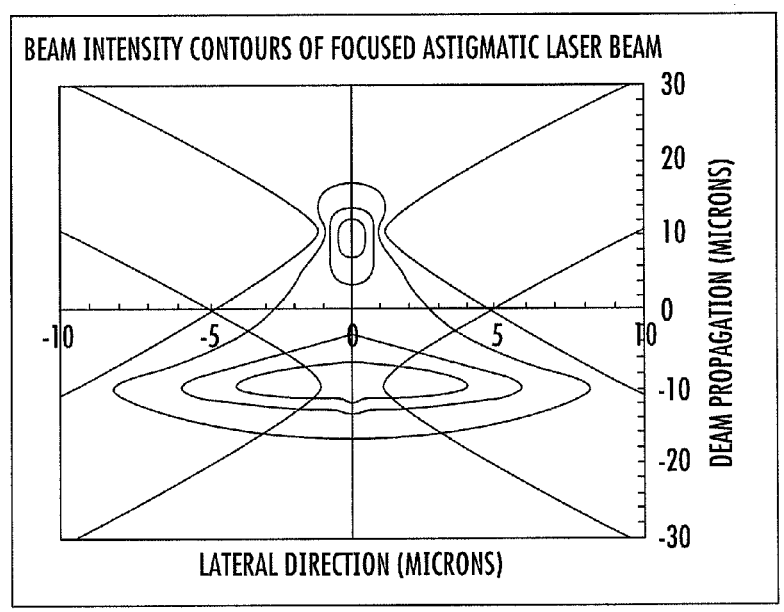
FIG. 4 is an intensity contour plot of a focused Gaussian astigmatic beam used in one embodiment of the current invention.

In additional embodiments of this invention, alternative beam intensity transforming techniques, well known to those skilled in the art, are employed in the optical system of the invention to tailor the beam intensity to generate multiple scribe lines in the target material. One such method utilizes astigmatic beam focusing to create two distinct regions of high optical intensity, separated by a determined distance. FIG. 4 displays an intensity distribution plot of a focused astigmatic Gaussian beam, in which the focal planes of the X and Y axes are separated by a distance of 20 μm. Note the presence of two distinct high intensity regions (distinguished by the constant-intensity contour lines). When directed at the target material, these two regions can be used to create multiple laser scribe features.

Multiple sub-surface modification lines (sometimes together with a surface scribe line) can be used to precisely break brittle materials like sapphire and glass. Creating these multiple lines can be done with multiple passes of the laser beam. However, multiple passes increase the overall travel distance and processing time.

FIG. 5 schematically illustrates an arrangement for processing surface and/or sub-surface regions with multiple focused beams. An output from a pulsed laser apparatus is received by a multifocus beam generator that produces multiple output beams focused at different depths relative to the material, either simultaneously or sequentially. In some embodiments the beams may be generated with little or no temporal overlap between the corresponding output pulses, with longer delays, or any suitable combination. The output beams may have a time delay exceeding the duration of a single pulse, which may be less than about 100 ps.

In various embodiments the target material and pulsed beams may be moved relative to each other, for example with translation of the target material and/or optical sub-system. The arrangement may optionally comprise a 1D or 2D scanner, and/or a target positioner. For example, in some embodiments a scanner system may deliver scanning beams to the target material with a telecentric optical system (not shown), wherein the beams are rapidly delivered to the multiple focused positions. The scanning mechanism is repositioned to other target locations, with either continuous or discrete scanning motion.

The multifocus beam generator may be configured to produce sufficient time delay between output pulses (and the corresponding focused multiple beams) so that the plasma and material modifications at the different focus positions do not interfere with each other. Preferably, pulsed beam generation and focusing at multiple depths occurs much faster than any relative motion between a material and the beam. Therefore, the beam generation may be regarded as nearly simultaneous on a particular time scale. Processing throughput is thereby increased relative to that obtainable with multiple passes using a single pulsed beam focused at one depthwise location. In various embodiments the time delay may be below 10 ns, and in the range of about 100 ps to about 1 ns. However, longer delays may be preferred in certain other embodiments. In some embodiments the focused spots may be formed simultaneously.

One method for generating multiple scribe features in a transparent material employs a diffractive optical element (DOE) that is designed to generate multiple regions of high optical intensity at different locations along the beam propagation axis. FIG. 5a illustrates how such a DOE could function. These multiple intense regions, when directed at the target material, generate multiple scribe features for subsequent cleaving of the material.

In some embodiments multiple, collinear beams are generated and are focused through one focusing objective (or alternatively a scanner system). The beam characteristics (size, beam waist position, divergence, etc.) of each beam are changed so that the focus position of each beam is different, although the beams are focused using the same delivery system.

Some examples of collinear multifocus beam generators are illustrated in FIG. 5b-1 to 5c-3. The figures schematically illustrate optical sub-systems suitable for producing multiple focused beams having depthwise spaced beam waists. Plots of optical power as a function of time illustrate examples of time displaced output pulses corresponding to the configurations. In these examples the multibeam generator receives a pulsed beam from the pulsed laser, for example a single pulse of a series of pulses. A pulse selector, for example an acousto-optic modulator, (not shown) may be controlled with the controller to selectively transmit a pulse based on specific material processing requirements. Multiple beams are then formed with the multifocus beam generator, at least two with different beam waist positions spaced depthwise. A laser apparatus for transparent material processing may include a source of femtosecond pulses, for example a commercially available fiber-based chirped pulse amplification (FCPA) system available from IMRA America (e.g.: FCPA µJewel). A Model D-1000 provides sub-picosecond pulses, output energies in a range of about 100 nJ to 10 uJ, a variable repetition rate range of 100 KHz-5 MHz, and average power of about 1 W.

Some embodiments may include multiple laser sources, for example picoseconds (ps) and/or nanosecond (ns) sources providing pulse characteristics suitable for particular transparent material processing applications. Many possibilities exist.

In some embodiments two depthwise spaced focused beams are produced, and at least one beam focused within the material. The second beam may be focused at or near a surface of the material, within the material, or at any depthwise location suitable for material modification. A single input laser beam is first split into two beams using a polarizing beam splitter as will be further discussed below. The time delay between the two beams can be adjusted by changing the length of the beam path. For example, the delay can be adjusted by inserting an additional series of mirrors in one beam path to increase the travel distance, and thus the time delay between the two pulses. With use of fs or other short pulse widths (e.g.: less than 100 ps) a free-space optical path length can be short, thereby providing a compact system. The optical path may be also sufficiently long to avoid temporal overlap between pulses, whenever such overlap is to be avoided. A temporal separation longer than a pulse width may avoid optical interference between beams, and increased temporal separation may be configured to avoid interaction with the plasma, or other product of the laser-material interaction.

In the examples of FIGS. 5b-1, 5b-2 and 5c-1 to 5c-3, two methods are illustrated for separating an input beam and combining to form collinear output beams. A first method uses a polarization difference and the second uses wavelength difference. Other embodiments may utilize a combination of polarization and wavelength based techniques to spatially and/or temporally separate the input beam from the pulsed laser, and to form multiple focused output beams.

Referring to FIGS. 5b-1 and 5b-2, a polarizing beam splitter divides a beam from the pulsed laser source into two orthogonally polarized beams. In FIG. 5b-1, the p-polarized beam is diverging at the focusing Objective, and the s-polarized beam is collimated. Therefore, in this example, the s-focus is closer to the beam generator and less deep than the p-focus relative to the target material. In FIG. 5b-2, the p-polarized beam is converging at the focusing Objective and the s-polarized beam is collimated, and the beam having p-polarization is focused closer to the beam generator than the s-polarized beam, and more shallow relative to the target material. Alternatively, the optical system could be configured so that the s-polarized beam converges or diverges to increase the focus separation.

In the example above, the polarizations of the two beams are orthogonal. It is known that such polarization differences can affect the laser processing. FIG. 5b-3 illustrates such polarization sensitivity. The machining of the Silicon substrate result is strongly affected by the linear polarization. In some embodiments circular polarization may be utilized to avoid or reduce polarization sensitive effects. A quarter-waveplate (not shown) can be used after the beams are combined. The linearly polarized beams exiting the quarter-wave plate will become circularly polarized outputs, but out of phase by 180 degrees.

In various embodiments a fundamental wavelength may be converted to one or more converted wavelengths, for example with harmonic generation or other wavelength conversion techniques. The beams having different wavelengths are then focused at different depths after combining.

Figures 1, 5C:
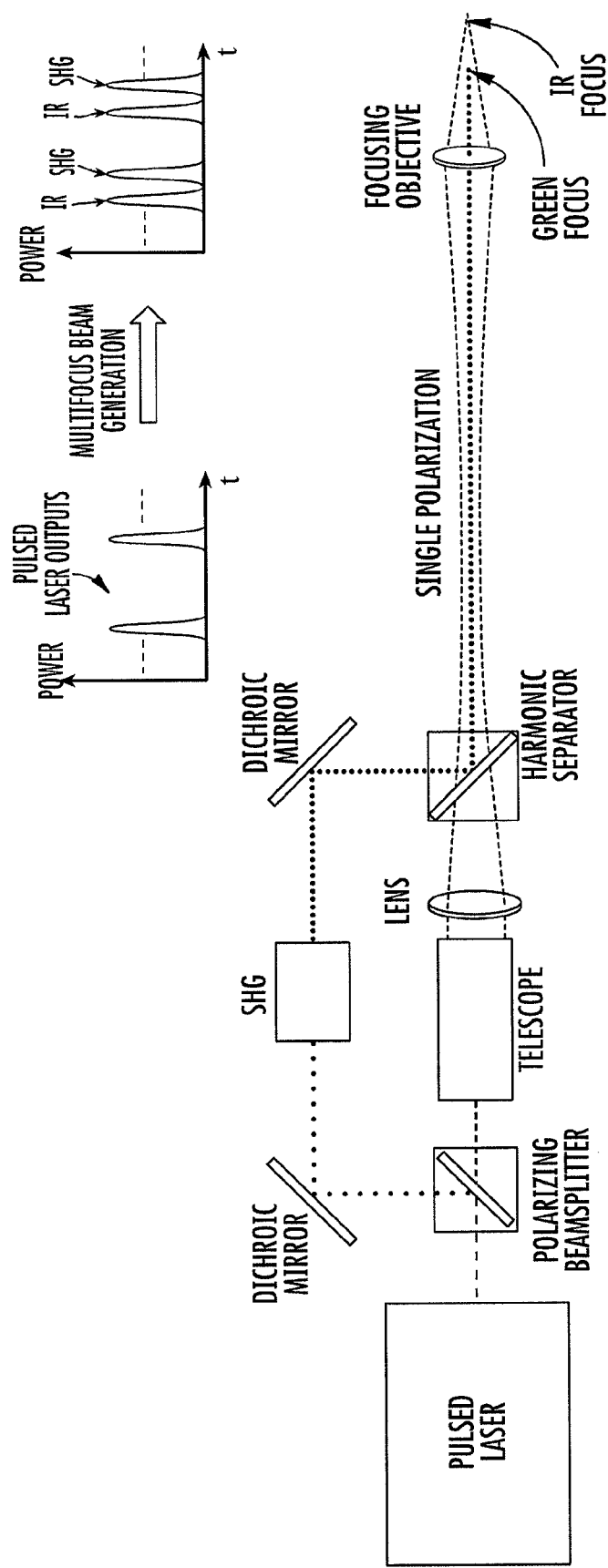

Referring to the examples shown FIGS. 5c-1 and 5c-2, wavelength differences are used to form multiple focused beams. In these examples, one beam is split and then converted to a different wavelength prior to re-combining. In these examples the near IR wavelength is frequency doubled to a green wavelength, and then recombined with a harmonic separator. As in the polarization based example above, the divergence/convergence of one or both of the beams is controlled to adjust the focus position separation of the two beams.

Another alternative illustrated in FIG. 5c-3 provides collinear focused beams without splitting. The transmission of residual IR through a frequency conversion crystal is exploited. When an IR beam is converted to the second harmonic (SHG), not all of the IR energy is converted. Also, the beam propagation characteristics after the crystal are different. By way of example, the temporal characteristics illustrated in FIG. 5c-3 illustrate a slight time displacement (not to scale) between the output pulses representative of propagation within a dispersive medium, as could be produced with certain femtosecond pulse widths. The two beams (SHG and residual IR) can be used for collinear machining. In this example, the ratio between the SHG and IR beam energy can be controlled by adjusting the focus of the beam into the crystal. This focus adjustment which would also control the relative convergence/divergence of the two exiting beams, thus the focus position separation.

Figures 2, 5D:
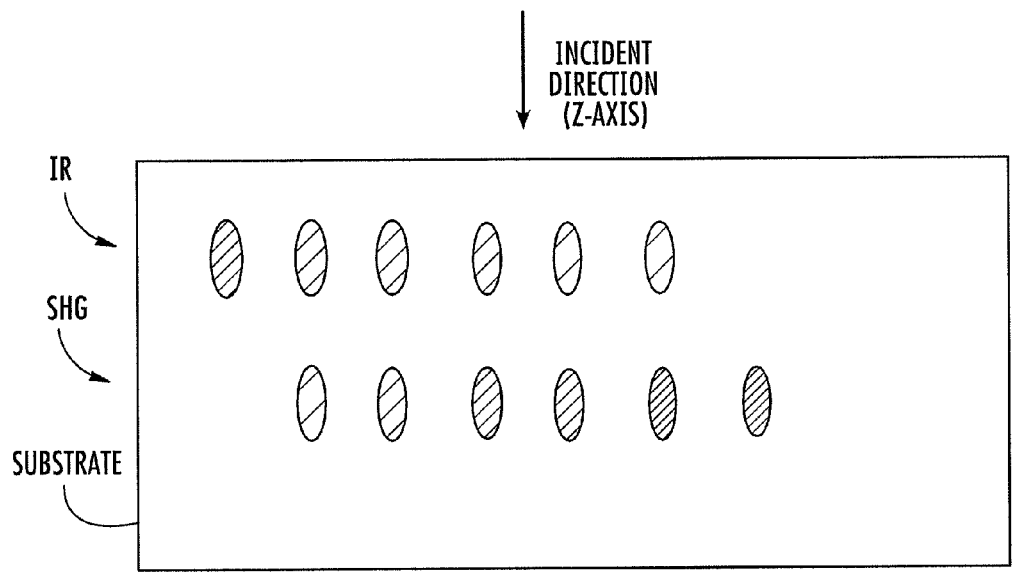
FIG. 5d schematically illustrate examples of features formed at different depths, and having various shapes and contrast.
Figures 3, 5D:
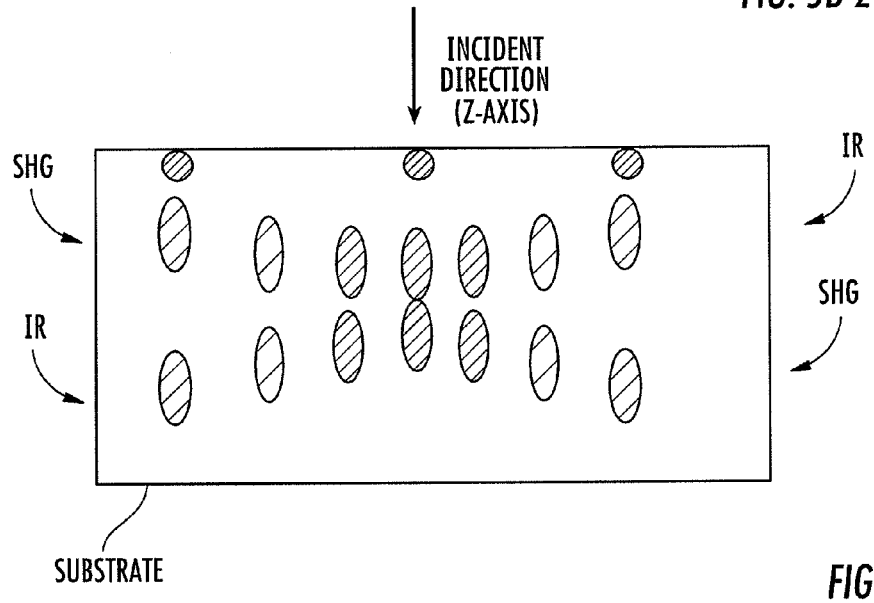

FIG. 5d-1 to 5d-3 schematically illustrate examples of features which may be formed on or within a material with a collinear multifocus beam generator. In these examples the beams are incident approximately normal to the surface as shown (e.g.: along Z-axis), and the material is translated to form the features at various lateral (X-Y) positions. The relative positions of the features along the Z-axis, and the longitudinal spans (i.e.: the feature length along the Z-axis) can be controlled with various focus settings, and with the incident beam power/fluence of each of two beams. In the examples of FIG. 5d-1 the two beams producing features correspond to near IR and SHG beams respectively. However, a collinear, multifocus beam generator can be configured in such a way that additional beams are generated at various wavelengths and/or polarizations.

The feature shape, including the longitudinal span, may be controlled in various ways. For example, a system can be configured in such a way that both the NIR and SHG beam fill a large fraction of the objective lens. The objective lens may be an asphere used to focus the beams, a group of lenses, or other suitable arrangement of optical elements. The features formed with both SHG and NIR beams may then appear localized and circularly symmetric. By way of example, FIG. 5d-1 is a schematic illustration showing a side view of features having a dot shape. The dot shaped features indicate tight foci where most energy is absorbed locally. FIG. 5d-1 also schematically illustrates how feature contrast may vary with laser power in each beam. For example, the illustrated dense shading is representative of high contrast when viewed with a microscope and transillumination, or any other suitable arrangement for illumination and imaging. In this example internal features are formed with an SHG beam (top row) and NIR beam (bottom row), with SHG power increasing from right to left, for example from 0 mW to 300 mW (right to left). A constant scan speed may be utilized, for example about 50 mm/s.

A line shaped focus with relatively large longitudinal span may be desirable for various scribing applications. Elongated features, for example long features having a large aspect ratio of depth to width, facilitate clean smooth breaking once the glass is under pressure. In some embodiments a series of features may effectively act as perforations along a path that facilitate later separation; the cracks will propagate substantially along a direction defined by the features. An aspect ratio of a feature may be about 2:1, 3:1, 5:1, 10:1 or larger.

In contrast to the tight focal arrangement used above to obtain the dot shapes, the SHG telescope may be adjusted so that the beam underfills the objective. With both the IR and SHG beams underfilling the objective, the machined features may become elongated with a line shape. FIG. 5d-2 is a schematic illustration showing a side view of features having such an elongated feature shape, and is representative of an image obtained with a microscope or other suitable imaging and illumination arrangement. In this example the features may be formed with SHG beam (bottom row) and near IR (top row), with SHG power varied from 0 mW to about 200 mW (left to right, with a feature being absent with 0 mW power or below the energy density threshold for material modification). The size of the feature may be controlled with power. For example, the feature's dimension increases with increasing power, at least over a substantial operating range.

For a given material type, longitudinal span data is useful for determining suitable parameters for scribing or other machining processes. A test pattern as schematically illustrated in FIG. 5d-3 may be generated with adjustment of focal positions of the beams, power, fluence, scan speed or other parameters. Features may be formed with single scans, multiple scans, or any combination. The features may be localized or elongated, overlapping or non-overlapping, or any suitable combination of sizes, shapes, lateral or depthwise spacing, or contrast suitable for a given application. Such a test pattern is useful to determine a process window which defines process limits for a particular substrate material.

One advantage of a configuration having both NIR and SHG is that one wavelength may be used to ablate the glass surface, while the other forms internal perforations for the crack to follow. Moreover, various materials absorb different wavelengths with varying efficiency. For example, it was found that 522 nm light creates optical waveguides in fused silica much easier than with IR. In any case, with adjustment of the distance of the NIR focusing lens relative to the objective, a NIR feature can be moved up or down relative to an SHG feature. This adjustment, used with the power control, can be used to control the size of machined features and their relative distance. The spacing between the elements may increase depthwise separation of the features, which is desirable in various embodiments. For example, increasing the depthwise separation may affect how the cracks propagate in the glass; the cracks may propagate with the features inside the glass facilitating clean breakage. However, in some embodiments, the lens separation may be configured to produce overlapping features. In various embodiments increasing the feature separation may facilitate controlled cracking.

By way of example, and as schematically illustrated in FIG. 5d-3, the optical system may be adjusted such that the features are widely spaced, overlapping, or are reversed relative to each other in the depthwise direction. Also, features may be formed at or near the surface and/or below the surface. Moreover, more than two beams may be utilized.

In some embodiments for scribing or other applications a good balance between the surface ablation and the internal feature is beneficial. The ratio of SHG to IR power can also affect the features. As the SHG power increases, the SHG feature size increases but the NIR feature size decrease.

In embodiments utilizing multiple wavelengths, various power combinations are obtainable with adjustment of the angle incident on a doubling crystal, or other frequency converter. For example, SHG and IR power can be adjusted with rotation of a SHG crystal relative to the beam and the spot size inside the SHG crystal. Adjustment over a range of about 45° will maximize SHG and minimize IR. Approximately equal power may be obtainable at 30°. Although the angle may vary with crystal type and other parameters, various combinations can be used for scribe-and-break process.

A system similar to that illustrated in FIG. 5c-1 was used in an initial demonstration. In this example, a femtosecond pulse was generated with the IMRA FCPA µJewel D-1000, and the received laser beam was split into two beams with a polarization beam splitter (PBS). The power ratio between the two beams was adjustable with a ½ wave plate before the PBS. The p-polarized light was expanded with a telescope, and an optional lens introduced divergence into the beam. The s-polarized light was converted into its second harmonic generation (SHG) with a LBO crystal. The two beams were combined by a harmonic separator (transmits IR, reflects SHG) and focused by an aspheric objective lens. Because of the difference in their refractive indices and divergence/convergence, the SHG was focused at a shorter distance (shallower) than the NIR beam.

Internal lines were written with three settings: two beams combined, NIR only, and SHG only. The FCPA laser repetition rate was set at 500 kHz. The laser pulse repetition rate also corresponds to the rate at which the multifocus generator generates multiple focused beams spaced depthwise (during active processing periods processing, with all pulses selected for processing). SHG power was about 100 mW, and the NIR power was about 250 mW (SHG power was low due to leakage from one mirror). The objective lens was a 40× asphere, and a 500-mm lens was used to form a non-collimated beam and adjust the overall focal length. The glass sample (soda lime) was scanned at 5 and 2 mm/s, respectively. After writing, the sample was scribed and broken orthogonally to the line direction.

The depthwise separation of the two vertical features was about 70 µm in this example. Formation of the top feature (formed with shallow focus) did not affect the bottom one, and in various embodiments independently forming depthwise features is desirable.

A second set of marks were formed with different spacing in depth. The 500-mm focusing lens was removed. The near-collimated NIR beam was focused deeper. The separation between the two sets of marks was measured to be approximately 170 um. Hence, two features were produced at different depths with a single scan.

In various embodiments a multifocus beam generator as illustrated in FIG. 5, and in the specific examples, is useable to produce marks or other features at two depths with one single scan. Further, the distance in between the features can be adjusted using optical elements within the multifocus beam generator. Depthwise center to center spacing of features may be in the range of a few microns to hundreds of microns, depending on a particular system configuration. Various other choices of parameters may be selected based on specific material properties and processing requirements. For example, focused spots may be circular or non-circular. Spot dimensions may be the range of about a few microns up to about 100 µm, and fluence may be determined relative to a threshold fluence for material modification. In various embodiments fluence may be in the range of about 1 J/cm$^2$ to 100 J/cm$^2$. By way of example, sub-surface scribing of glass and/or sapphire may be carried out with fluence in the range of about 10-50 J/cm$^2$ with SHG green wavelengths, and 50-150 J/cm$^2$ in the IR. Estimated surface ablation thresholds of various glass and sapphire material samples are in an approximate range of about 1-5 J/cm$^2$. As specific examples, sub-surface modification of various glasses may occur with about 20 J/cm$^2$ SHG and 100 J/cm$^2$ IR, and sub-surface modification of Sapphire with about 40 J/cm$^2$ SHG and 80 J/cm$^2$ IR. Thresholds for surface modification of these materials may be about 2.5 J/cm$^2$ SHG and 3 J/cm$^2$ IR for glass, and 1.5 J/cm$^2$ SHG and 2 J/cm$^2$ IR for sapphire.

Average power less than about 1 W may be suitable for processing many materials, for example 100-500 mW SHG, and 300 mW-1 W IR. A pulse repetition rate may be in the range of about 1 KHz to 100 MHz, with pulse energy in the range of about 100 nJ to 100 µJ within a spot.

In various embodiments relative motion of target material and a pulse laser beam may be in the range of about 1 mm/sec to 10 m/sec, depending on processing requirements. For example, the focused beams and/or workpiece material may be scanned at a rate of a few mm/sec up to 100 mm/sec, about 1 m/sec, and in some embodiments utilizing beam scanners up to about 5-10 m/sec. In some embodiments the material may be translated at speeds in the range of about 10 mm/sec to about 100 mm/sec. Many other variations are possible Moreover, a system of FIG. 5 may also include dynamic focus mechanisms (not shown) to adjust the focal positions, used alone or in combination with 1D or 2D beam scanners and/or spatial light modulators, and/or motion of the material. The controller may be in communication with the multifocus generator, scanner, and optics for dynamic adjustment, calibration, and other operations. For example, with a polarization based method, a pulse laser output may be divided into two beams using a half-wave plate and a polarization beam splitter. The power ratio can be varied with rotation of the half-wave plate. If multiple passes at different depths are used, the power splitting ratio may be different when one beam is focused at the surface compared to a case when both beams are focused within the material. If SHG wavelength conversion is used, the SHG conversion efficiency can be varied to adjust the power ratio. In at least one embodiment adjustment may be made with control of the SHG temperature crystal, or with a focal position of the beam within the crystal. The techniques disclosed herein may also be extended to generate more than two beams, either with time separation or simultaneously. Various tradeoffs in processing time and the number of beams may be made depending upon particular workpiece processing requirements.

As discussed above, experiments by the inventors also showed the shapes of elongated features was not substantially affected when a nearby feature was formed, provided depthwise spatial separation of the beams was sufficient. It was also observed that the features obtained at speeds 50 mm/s and 100 mm/s speeds were almost identical in the cross-section view, suggesting that in some applications an increase in scan speed over a significant range may not greatly affect results.

Interference and crosstalk effects were also sufficiently low in the experiments. Moreover, ultrashort pulses generated with systems of FIG. 5b-5c have sufficient time delay to avoid temporal overlap and plasma interference, for the conditions tested. For example non-overlapping pulses having widths in the range of about 10 fs—tens of picoseconds can be generated with compact versions of the systems of FIG. 5, or similar arrangements. A series of pulses, with each pulse focused at a different depth, may be utilized to form more than two features with extensions of the arrangements in FIGS. 5b-5c having additional optical paths and/or sources. Similarly, a burst of pulses may be generated with the laser system, and applied to the material at a given processing location to form depthwise focused beams and corresponding features, for example the pulsed laser source may generate two pulses with a time separation within the range of 1 ns to 10 ns, each of the two pulses then are split, combined, and focused to form features as shown above, but in a burst mode configuration.

Many possibilities for machining exist and are dependent on overall laser power, speed, and material processing requirements. These multibeam techniques may also be utilized in cutting, welding, joining, marking, or other machining operations, and other applications where high machining speed is beneficial. In some embodiments maximum near-IR power may be about 1 W with very low SHG, or maximum SHG of 400 mW with very low IR. Processing speed may determine power requirements, but at least some results indicate the speed may change over a relatively wide range (e.g.: 2:1, at 50 mm/sec and 100 mm/sec) without substantially affecting feature formation. Processing conditions with different feature separations may provide for increased scan speed. For different materials and different sample thickness, the feature separation and power combination may be adjusted for optimum breaking.

In various embodiments the focused beams are collinear and approximately normal to a surface of the target material as illustrated in the above examples. In other embodiments the beams may be offset and non-collinear, and formed with a high speed, small angle, beam deflector operating at a rate much faster than the translation speed. In some embodiments an optical system may be configured to deliver depthwise spaced focused beams with off-axis angles of incidence. Features may formed having length along a non-normal direction relative to a material surface, and may include a beveled cut. Various NIR focusing lenses may be used to produce different feature separations, including partially overlapping features, which could be used to optimize processing of various substrates. In some embodiments a multifocus generator may be configured for both wavelength and polarization based splitting, and may form multiple focused beams, for example four depthwise spaced beams. The multifocus generator may be configured to produce the focused beams in a temporally ordered series, for example progressing from deep-focus to shallow-focus relative to the material.

In some embodiments, particularly for processing thick transparent materials, multiple passes can be used wherein at least one pass includes generation of multiple, depthwise spaced, focused beams, in the deep-focus to shallow-focus sequence, or other suitable series. One such example includes processing of flat panel displays or similar structures. Moreover, transparent materials as used herein materials that do not absorb significant radiation at an operating wavelength, and is therefore not limited to visibly transparent materials.

For a variety of beam-focusing and/or intensity-mapping methods used to generate multi-scribe ablation features, additional optical components could be introduced to generate an elliptical component to the overall beam shape. By orienting the elliptical beam such that the long axis is parallel to the direction of beam scanning, higher scanning speeds can be achieved. Higher scanning speeds can be achieved because the elliptical beam shape allows for sufficient pulse-to-pulse overlap for the machining of smooth and continuous scribe features (as opposed to dotted scribe features resulting from spatially-separated pulses ablating the material). While increased pulse overlap, and higher scanning speeds, could also be achieved with a larger circular beam spot, this would at the same time result in a wider scribe feature width, which is often undesirable.

2. Ultrashort Pulse Laser Welding

Figure 6A:
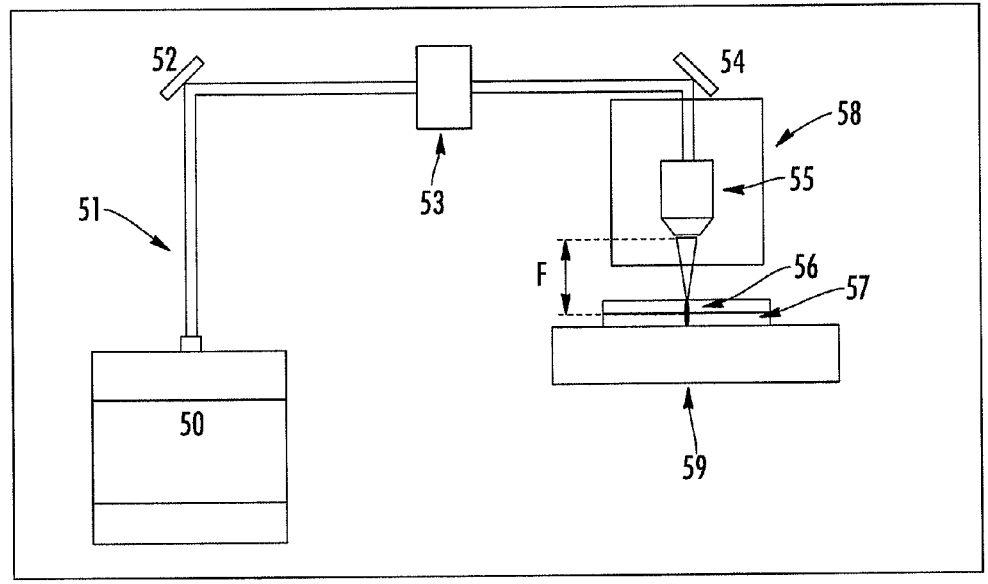
FIG. 6 is a diagram of a system used in a method for welding transparent materials according to one embodiment of the current invention, where (a) shows the system schematic, and (b) is an enlarged view showing the detail of beam focusing within the adjoining materials.
Figure 6B:
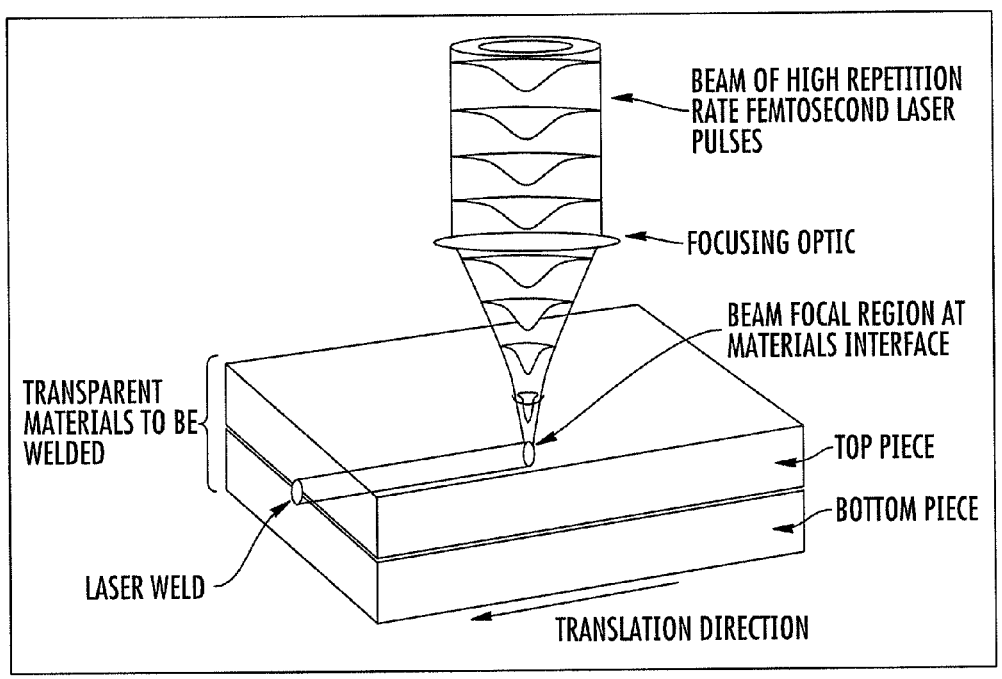

Another embodiment of the current invention relates to a process for laser-welding of transparent materials. As shown in FIG. 6, this embodiment requires the use of a laser system (50) producing a beam of ultrashort laser pulses (51) at a high repetition rate; a focusing element (55) (e.g. lens, microscope objective) of sufficient focusing power; and at least two materials (56) and (57) to be joined together, at least one of which is transparent to the wavelength of the laser. In addition, a beam focus positioning stage (58) is used to adjust the focus position of the laser beam (51), and an automated motion stage assembly (59) is generally required for moving the work pieces (56) and (57) relative to the focused laser beam.

In this embodiment, the two materials ("top piece" (56) and "bottom piece" (57)) to be laser-welded are placed in contact with each other to create an interface with little or no gap between their surfaces; a clamping force may or may not be applied to the two pieces. A lens (55) is then positioned in the path of the laser beam to create a focal region of high intensity laser radiation. The two transparent materials (56) and (57) are positioned relative to the focused laser beam such that the beam focal region spans the interface of the top piece (56) and the bottom piece (57). With sufficient laser intensity, welding of the material interface will occur. By moving the transparent materials (56) and (57) relative to the beam focal region, while at the same time keeping the interface of the materials (56) and (57) in close proximity to the beam focal region, a determined length of laser welding can be achieved. In a particularly unique application of this embodiment, the materials (56) and (57) could be positioned such that the focused laser beam travels through the top (transparent) piece (56) and forms the focal region near to the interface of the top piece (56) and the bottom piece (57), resulting in welding of the two materials.

Unlike other laser welding processes, the process of the invention welds by utilizing primarily nonlinear absorption rather than linear absorption. Because of this, there are unique properties in this welding process. The nonlinear absorption is very intensity dependent so the process can be limited to the focus of the laser beam. Thus the absorption can be made to occur only deep within a transparent material around the focus. Typically nonlinear absorption by ultrashort pulses leads to plasma formation and very little (if any) heat deposition, thus ablation with ultrafast lasers leads to a very small heat affected zone (HAZ). However, by keeping the intensity low enough so ablation does not occur but high enough for nonlinear absorption to occur, some heat is deposited. If the repetition rate of the laser is increased sufficiently then the heat can be accumulated sufficiently in the material to lead to melting.

The laser system (50) emits an approximately collimated laser beam (51) of pulses having a pulse duration in the range of about 200-900 fs and a wavelength of about 1045 nm at a pulse repetition rate between 100 kHz and 5 MHz. The first beam steering mirror (52) directs the laser beam to the power adjust assembly (53), which is used to adjust the pulse energy that is used for the welding process; specific methods for achieving such attenuation are well known to those skilled in the art. The second beam-steering mirror (54) directs the beam onto the beam focusing objective (55). The beam focusing objective (55) focuses the laser pulses to achieve the appropriate fluence (energy/unit area) for the process, which has a maximal value at approximately a distance (F) from the beam focusing objective (55). The beam focus positioning stage (58) translates the beam-focusing objective (55) such that this maximal fluence region is located at the interface of the target materials (56) and (57). The XY stage assembly (59) moves the target materials (56) and (57) relative to the focused beam so as to provide for the ability to generate a linear weld feature, or an array of circular weld features, at the interface of the target materials (56) and (57).

Figure 7:
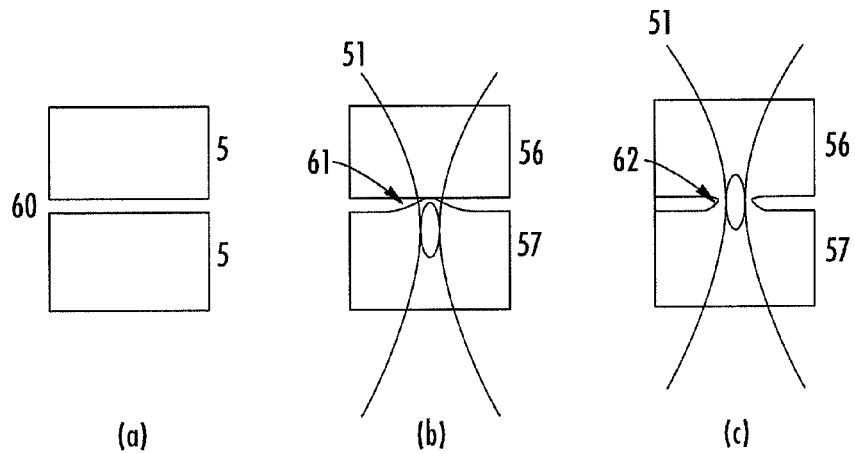
FIG. 7 is an illustration of the welding process where a raised ridge is used to fill the gap between two pieces. (a) shows the gap, (b) shows the ridge formed by focusing the laser beam slightly below the surface of the lower piece, and (c) show the weld formed when the laser focus is moved up to the interface between the raised ridge and the upper piece to be bonded.

FIG. 7 shows another embodiment of this invention where welding is desired between two pieces separated by a small gap (60). First, the laser beam (51) is focused below the surface of the bottom piece (57). With the proper control of the pulse energy and focusing conditions, a raised ridge (61) is formed as the sample is translated relative to the beam focus (or as the beam is moved relative to the target). This raised ridge (61) bridges the gap between the top and bottom targets. A second pass of the laser with the beam focus raised to the height near the interface between the top of the raised ridge (61) and the top piece (56) then forms the weld (62).

3. Visible/Invisible Laser Marks

Figure 1A:
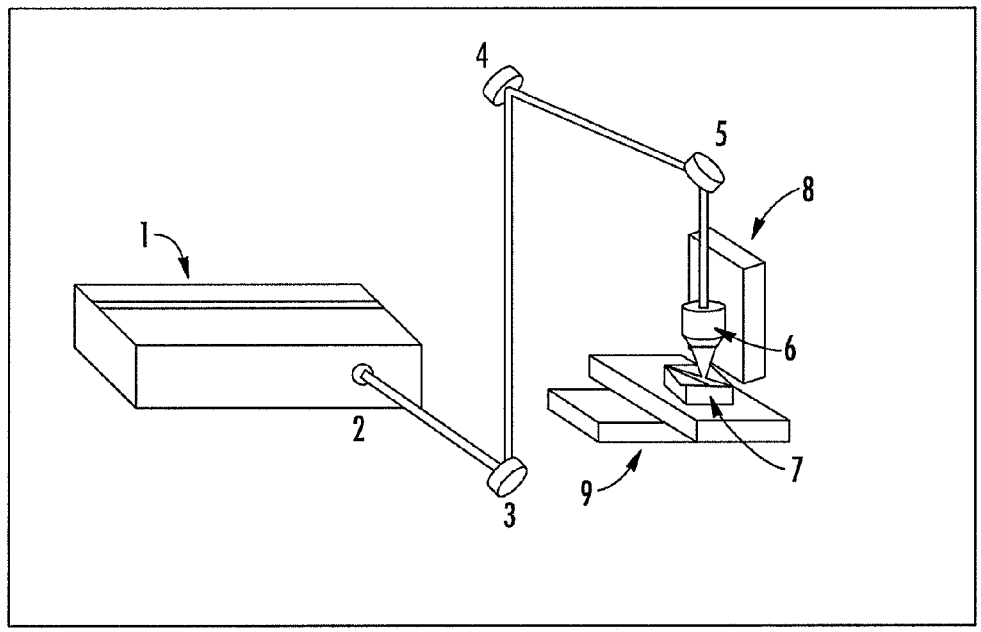
FIG. 1 is a diagram of a system used in a method for scribing transparent materials according to one embodiment of the current invention, where (a) shows the system configuration, and (b) shows a detail view of the scribing and subsequent cleaving.
Figure 1B:
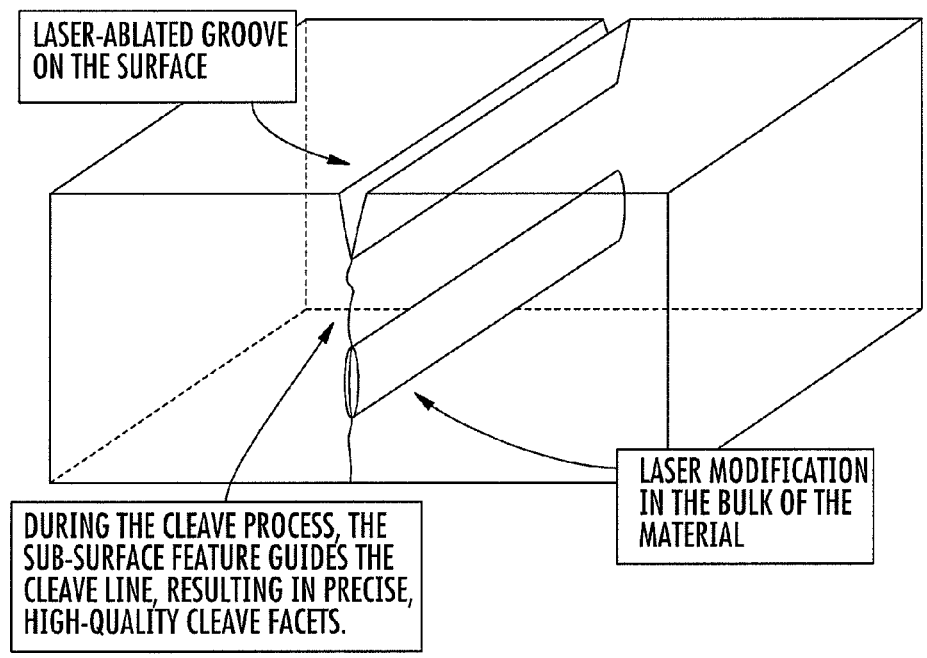
Figure 8:
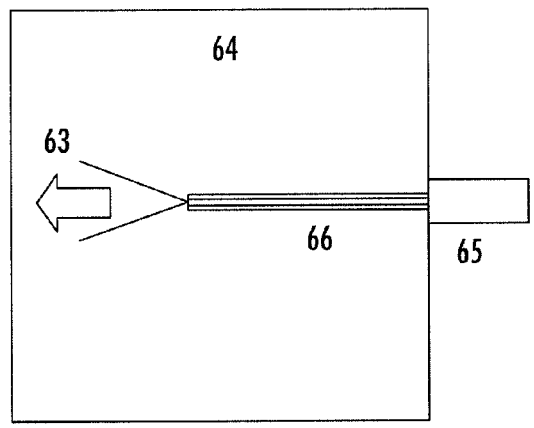
FIGS. 8-10 show illustrations of the sub-surface marking, wherein an arrow mark has been used as an example of the markings possible according to the invention.

The same system shown in FIG. 1a can be used to make sub-surface marks in transparent materials where the applied laser beam is focused below the surface of the transparent material substrate FIG. 8 shows an illustration of the top-view of an arrow pattern (63) written in a transparent material (64) such as glass. A light source (65) injects light into an optical waveguide (66) that delivers the light to the arrow mark (63) to illuminate the pattern. The output numerical aperture of the optical waveguide should be properly designed to efficiently illuminate the desired source. Multiple optical waveguides can be used to illuminate different regions of a pattern. Controlling the timing of the different illuminating light sources can produce different decorative and signaling effects. Alternatively, the pattern can be illuminated directly from a properly focused light source, rather than using an optical waveguide.

FIG. 9(a) shows an illustration of a close-up of the top-view of the arrow mark (63) that is made up of parallel lines, all perpendicular to the direction of the illumination light. These parallel lines are generated by tightly focusing the laser light within the target substrate to create regions of material modification. FIG. 9(b) shows an illustration of the side-view of the arrow mark (63). The arrow mark is composed of a group of marks at different depths. These marks scatter the light delivered by the optical waveguide (66) towards the viewer (67). The brightness can be controlled by the intensity of the illuminating light, the size of the individual marks and the density of the marks.

Figure 10:
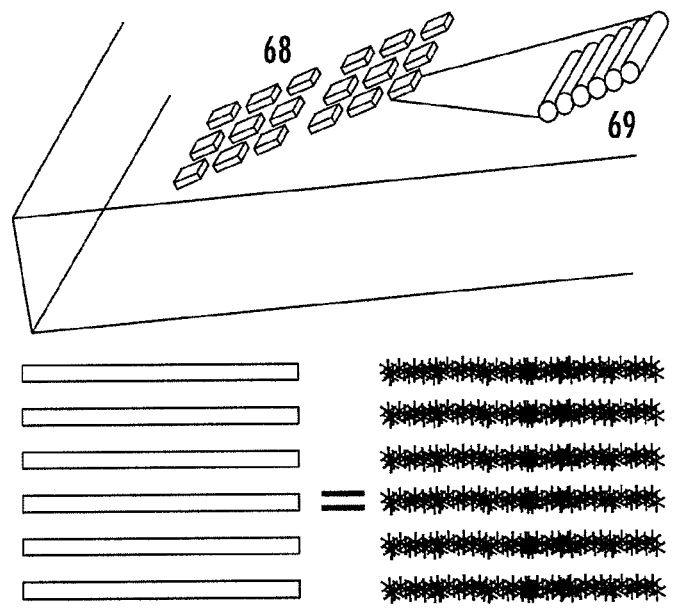

FIG. 10 shows an illustration of the concept where the pattern is composed of "pixels" (68) and where each pixel is made up of a group of parallel lines at different depths (69) formed by tightly focusing the laser light to modify the substrate material. Placing the marks at different depths helps to avoid "shadowing" when edge-illuminated. Marks closer to the light source would partially block the edge-illumination from impinging marks farther from the light source.

In examples shown in FIGS. 8, 9a, and 9b above, an arrow mark was shown. FIG. 10 provides an example of pixels formed from a group of parallel lines at different depths.

Embodiments of transparent material processing may be used to form many types of patterns detectable with suitable conditions for illumination and viewing. Further examples and configurations include a multi-layer icon display, non-edge illumination configurations, multilayer configurations, projection screen displays, or grayscale icons.

Substrate materials are not limited to glass, but may include plastics, polymers or any suitable material transparent to the writing laser's and illumination light source's wavelengths. Some exemplary configurations and patterns follow.

Visibility and Mark Characteristics—General Discussion

Visibility Trade-Off of a feature, for example a mark, may generally be defined as:

Clearly visible when illuminated (On Visibility)

Difficult to see (nearly invisible) when not illuminated (Off Visibility)

Several factors may affect visibility. The factors include, but are not limited to, mark size and aspect ratio, line density, and viewing angle.

Figure 11:
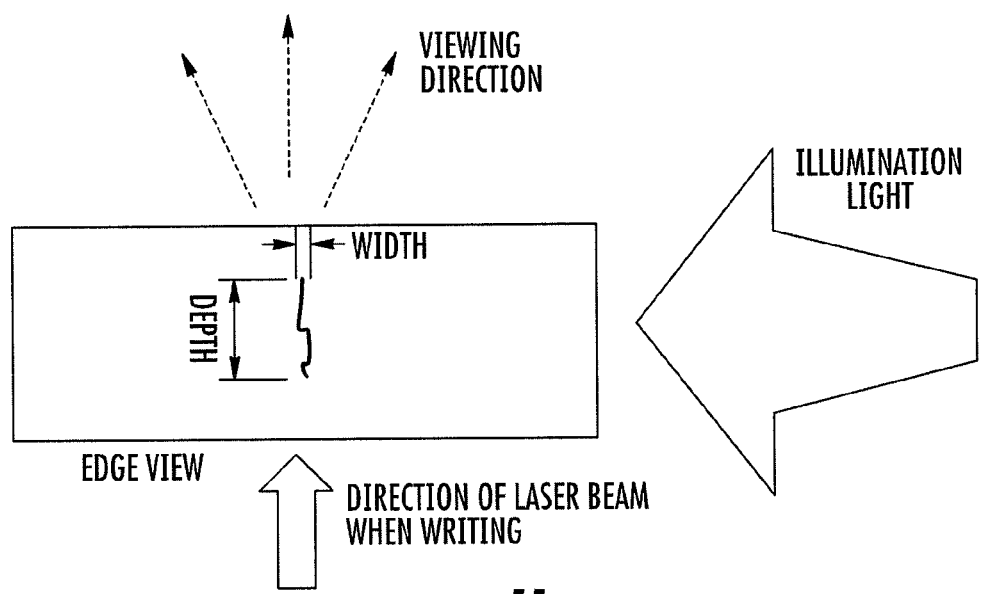
FIG. 11 is an illustration showing edge illumination and mark geometry for an exemplary mark aspect ratio.

Referring to FIG. 11, an effect of mark aspect ratio (e.g.: the ratio of the mark depth to width) is apparent. The wider the mark, the more visible it is when not edge-illuminated. The deeper the mark, the more light is scattered when edge-illuminated. The mark then becomes more visible.

Icons typically comprise raster-scanned lines which fill a desired shape. These lines may be generally perpendicular to the edge-illumination direction for optimal scattering. The Icon can be composed of lines oriented in different directions to control the relative brightness and/or illuminate different sections from different edges of the material.

The higher the line density, the more visible the mark when illuminated. More surface area is available for scattering the light. However, the increased density also increases the visibility when not illuminated. For example, the arrow marks and pixels of FIGS. 8-10 may be affected by line density.

The viewing angle, also illustrated in FIG. 11, generally affects visibility particularly for multiple Icon layers or for deep (long) marks.

In various embodiments Icon micro-mark cross-sections may have a high depth to width aspect ratio, along the direction of the writing-laser propagation, for example about 10:1. This asymmetric shape of the micro-micro results in an Icon brightness-dependence on viewing direction. The minimum Off-Visibility is typically produced with the micro-marks parallel to the viewing direction.

Figure 12:
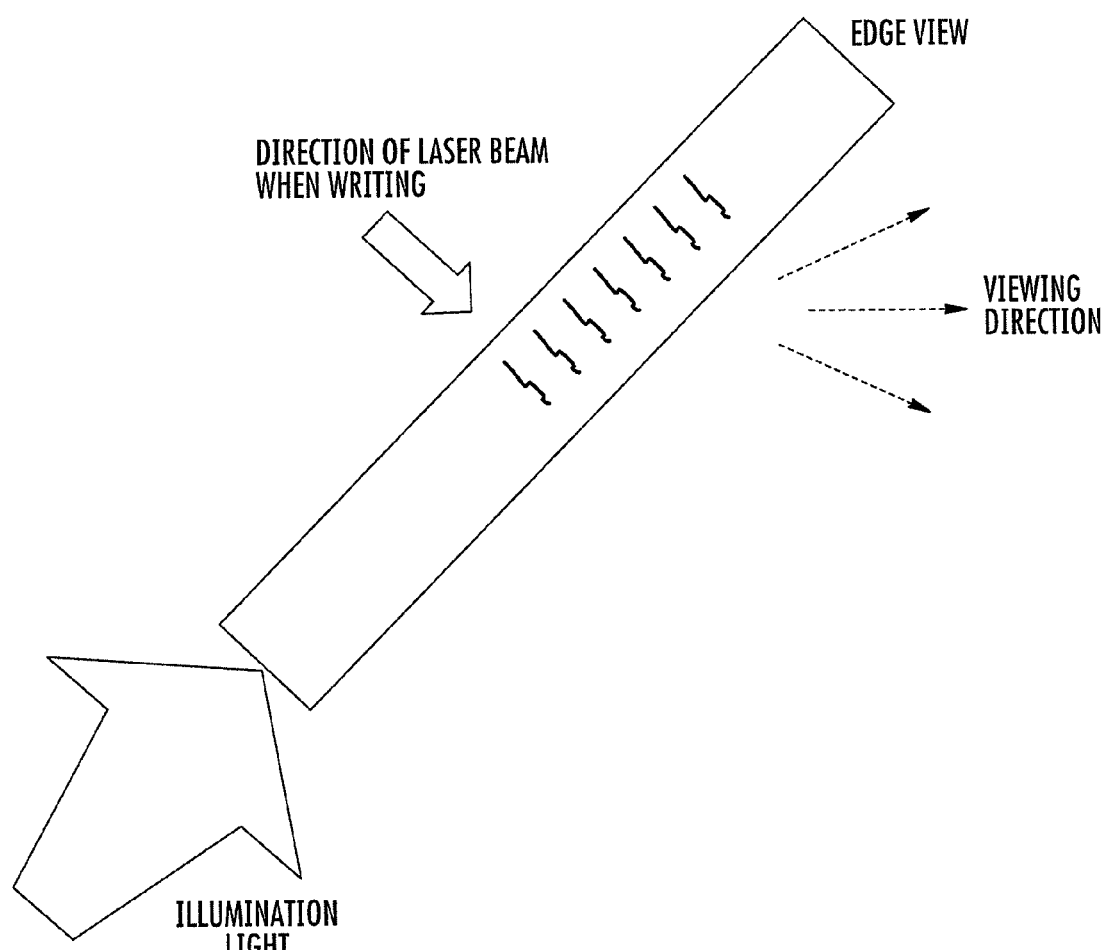
FIGS. 12 and 13 are two illustrations of edge-illumination, viewed from the edge of the substrate, showing the direction of the laser beam when writing the mark patterns and the direction from which the viewer system will detect the marked pattern.
Figure 13:
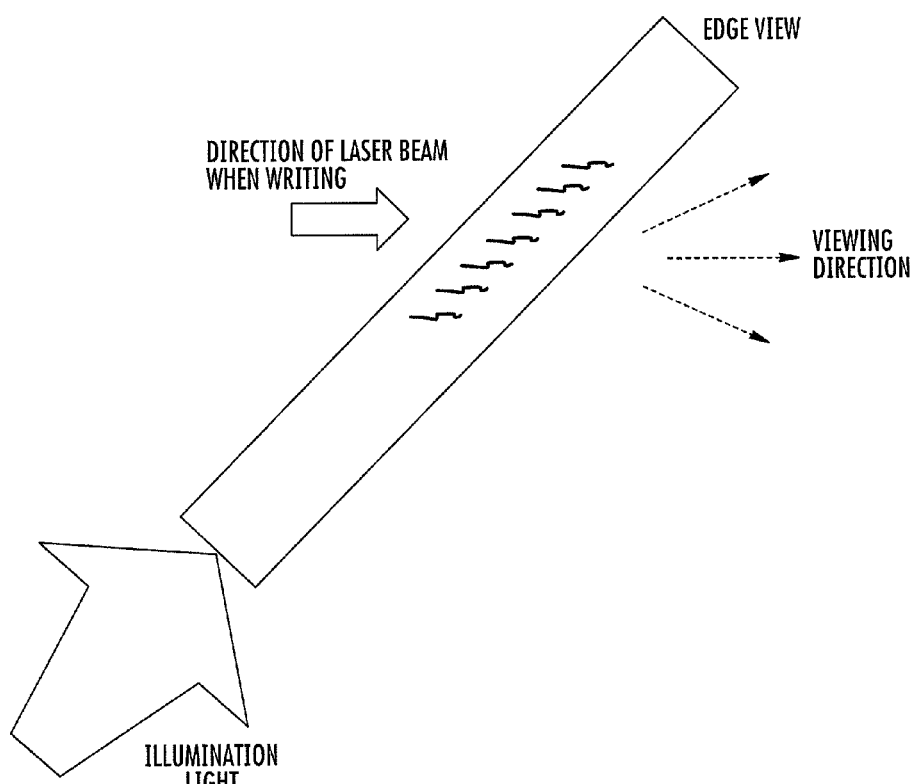

FIGS. 12 and 13 show side-views of an edge-illumination arrangement where the viewing direction is not perpendicular to the substrate surface. In FIG. 12, the micro-mark axis is perpendicular to the substrate surface, which is easier for fabrication. The micro-mark cross-sectional area that is perpendicular to the edge-illumination direction is maximized, but the micro-mark cross-sectional area perpendicular to the viewing direction is not minimized, which will affect the Off-Visibility.

In FIG. 13, the micro-mark axis is parallel to the viewing direction, minimizing the viewed cross-sectional area and the Off-Visibility. However, the micro-mark cross-sectional area perpendicular to the edge illumination direction is not maximized, affecting the On-Visibility.

Marks can be made at different depths. Marks or other features may also be formed on or within the surfaces of a substrate. Combined with different illumination configurations, various effects can be produced.

Reflective Marks

FIGS. 8-12 and 14 herein illustrate examples of sub-surface marks in transparent materials. The sub-surface marks were visible because of light scattering from localized micro-cracks that form the marks. The marks have a substantially larger cross-sectional area in the direction perpendicular to the edge illumination compared to the cross-sectional area of the mark perpendicular to the viewing direction. Thus, the marks are more clearly visible with edge illumination and nearly invisible without edge illumination.

Reflective marks were also produced, but were difficult to detect, with or without edge illumination. The poor detectability distinguishes reflective marks from the light-scattering marks shown in FIGS. 8-12 and 14. After several inconclusive experiments with various combinations of illumination and viewing angles, the inventors discovered the marks reflect the illumination light rather than scatter it. The strong specular reflection explained why the marks were not visible with edge illumination, like the light-scattering marks. The angle of incidence of the illumination light was roughly equal to the optimal viewing angle. The visibility difference is significant when observed along the optimal viewing direction compared to when outside the viewing direction, as described below.

Scanning electron microscope images of the cross-section of the reflective marks suggested that a "planar" crack was formed, creating an extended and continuous reflective region. By way of example, the plane of the crack can be defined by the axis of the writing laser beam and the direction of translation. The morphology is fundamentally different from the localized-micro-cracks in the scattering marks.

Without subscribing to any particular theory, the planar crack formation provides an explanation for the reflected light that produces the high visibility of the marks at certain combinations of illumination and viewing angles, a surprising outcome of the experiments and not initially recognized. Edge illumination produced poor contrast, and subsequent experiments showed non-edge illumination provided high visibility. Material modifications that appear under an optical microscope to be smooth, melted lines, resembling optical waveguides, are often created, but do not appear to be related to the visibility of the marks.

In one example, a series of sub-surface marks in a transparent material, where the collection of marks creates a desired pattern, form for example a two dimensional array. In this example, the marks are perpendicular to the material surface. However, the marks can be formed at other angles with respect to the material, provided the incident angle of the writing laser is less than the critical angle which is a function of the index of refraction of the transparent material. With the illumination light coming in from the right side along a first path, the illumination is reflected by the sub-surface reflective mark, where the angle of incidence is roughly equal to the angle of reflection. The light reflected by all the marks that make up the pattern make the pattern visible to the viewer. At other viewing positions, the marked pattern is not clearly visible because insufficient light is reflected. Some portion of the illumination light does not hit a reflective mark and passes straight through the material, corresponding to a second path, and the transmitted light.

In an example illustrating reflective mark illumination and viewing reflective marks formed in glass were illuminated with a flashlight, and viewed at various angles. An array of square-shaped patterns written below the surface of a piece of glass shows where the viewing position is optimal for the particular illumination angle. When the same array of marks using the same illumination angle is, viewed at a position away from the optimum viewing position the detected radiation is representative of a low level background caused by stray light, and the contrast may be further improved with increased control of the illumination.

Applications of reflective marks comprise: (1) product identification, (2) gradation and reference marks in transparent materials where clean, smooth surfaces are needed; (3) switchable warning indicators in windows where an unobstructed view is normally desired (when no warning is needed), but a highly visible warning is needed for some conditions; (4) anti-counterfeiting patterns to distinguish a legitimate product from an imitation, but which are not normally visible for example: expensive watches, gemstones, high-quality lenses and other products with transparent components.

Multi-Layer Icon Display

Figure 14:
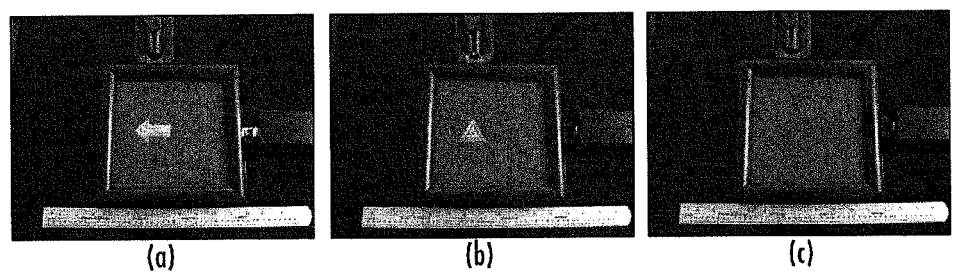
FIGS. 14a, 14b and 14c show photographs of two icons written at different depths in a single substrate, edge-illuminated by line-focused light sources.

FIG. 14 shows a demonstration of a multi-layer Icon Display where two Icons are written in a single substrate. The green arrow in FIG. 14a is edge-illuminated by the green light source to the right of the substrate. The red hazard sign in FIG. 14b is edge-illuminated by the red light source at the top of the substrate. FIG. 14c shows the substrate when both light sources are off. Both icons appear to be in the same region of the glass substrate. The individual icons can be selectively illuminated by switching the respective light source because the laser-written marks are at different depths in the glass and the two light sources are line-focused using a cylindrical lens, where the axis of the line focus is parallel to the plane of the glass substrate.

Figure 15:
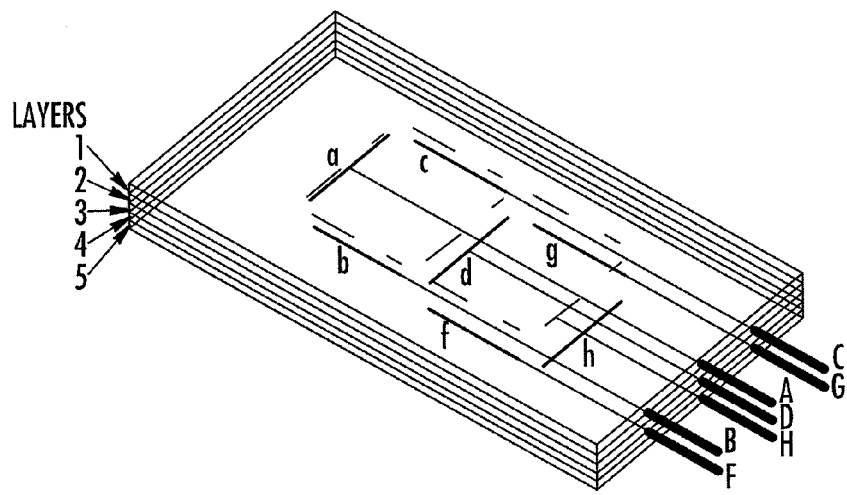
FIG. 15 is an exemplary illustration showing a multi-layer digital counter icon wherein selective illumination of particular elements in an array produces the desired discrete pattern.

FIG. 15 shows an example of an Icon with multiple substrate layers (five, in this case). Each individual element in the array can be separately illuminated from the other elements without tight focusing of the illumination light source. Element 'a' is in Layer 1 and can be illuminated by Light 'A'. Since Element 'a' is in a separate layer, the illumination light from Light 'A' is constrained by total internal reflection so that no other elements are illuminated. Similarly, Element 'd' is in Layer 3 and only illuminated by Light 'D' and Element 'h' is in Layer 5 and only illuminated by Light 'H'. A microscopic layer of air or a thin layer of a material with a sufficiently different index of refraction relative to the substrate layer, isolates each layer while being visually transparent.

Elements 'b' and 'c' are in Layer 2 and illuminated by Lights 'B' and 'C', respectively. Even though these two elements are in the same layer, they are separated by enough space that they are only illuminated by one light source. Similarly, Element 'f' and Element 'g' are in Layer 4 and illuminated by Light 'F' and Light 'G', respectively. This example shows how one character in an alphanumeric display or a digital counter could be designed. Other multi-element displays are also possible.

Figure 15A:
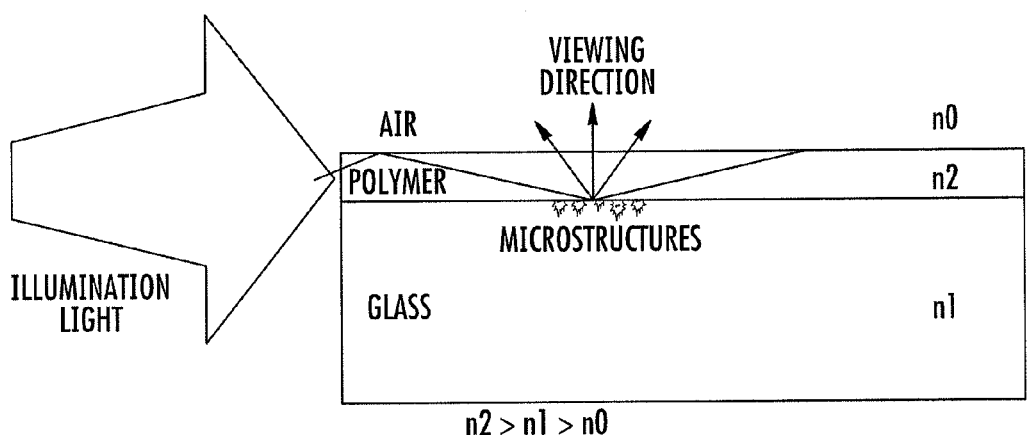
FIG. 15a illustrates an arrangement where the micromarks are written at or near the interface between two different substrates and total internal reflection in one substrate is used to edge-illuminate the pattern.

FIG. 15a illustrates an arrangement where the micro-marks are made at or near the surface a substrate. A transparent coating is then applied to the surface. The edge illumination light is guided by total internal reflection in this second layer and scattered off the micro-marks. The substrate may or may not be transparent. If it is transparent, it should have an index of refraction difference from the transparent coating that is sufficient for total internal reflection.

Figure 16:
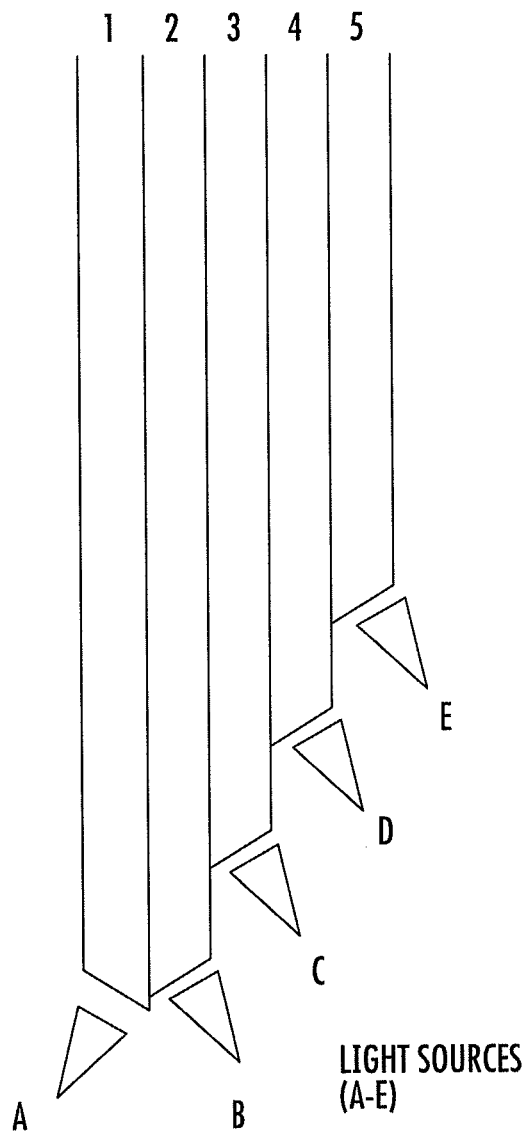
FIG. 16 illustrates offset edge illumination for coupling of edge illumination in thin sheets.

In some embodiments a stack of thin sheets may be utilized as illustrated in FIG. 16. If the edge-illumination light is larger than the thickness of the individual sheet, it would be difficult to separately couple light into a specific sheet without also coupling light into adjacent sheets. This would prevent targeted illumination of only one element in the array of elements or one substrate layer. Some offset between the light sources will improve the isolation between the different light sources and allow the illumination of only the desired array element. For the example shown in FIG. 16, there are 5 substrate layers (1-5). The five light sources (A-E), one for each layer, are offset and at an angle with respect to the substrate. The angle is such that total internal reflection will contain the light in each layer.

Non-Edge-Illumination

Figure 17:
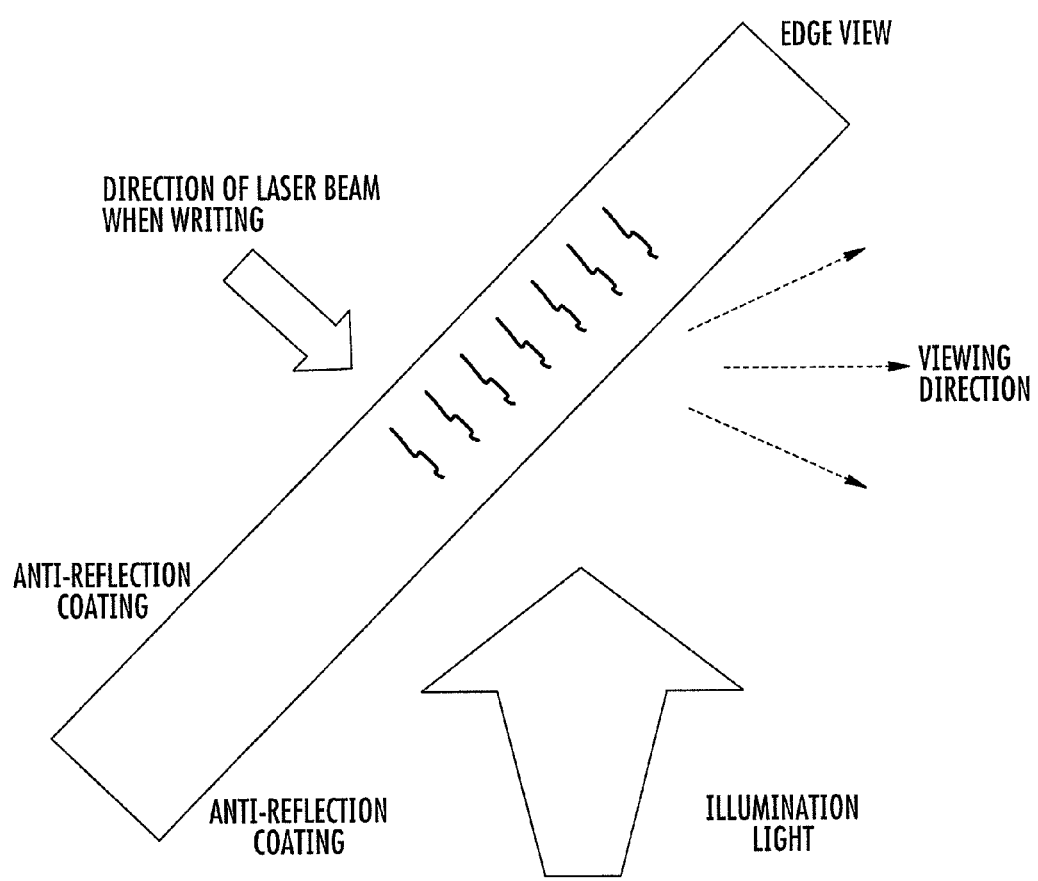
FIGS. 17-18 are two illustrations of non-edge illumination and of a projection screen, viewed from the edge of the substrate, showing the direction of the laser beam when writing the mark patterns and the direction from which the viewer will see the marked pattern.

In some embodiments an Icon is illuminated from a non-edge location. FIG. 17 is an illustration showing non-edge illumination of an Icon wherein the substrate is non-orthogonal to the illumination and viewing directions. The writing direction, however, was orthogonal to the substrate.

Figure 18:
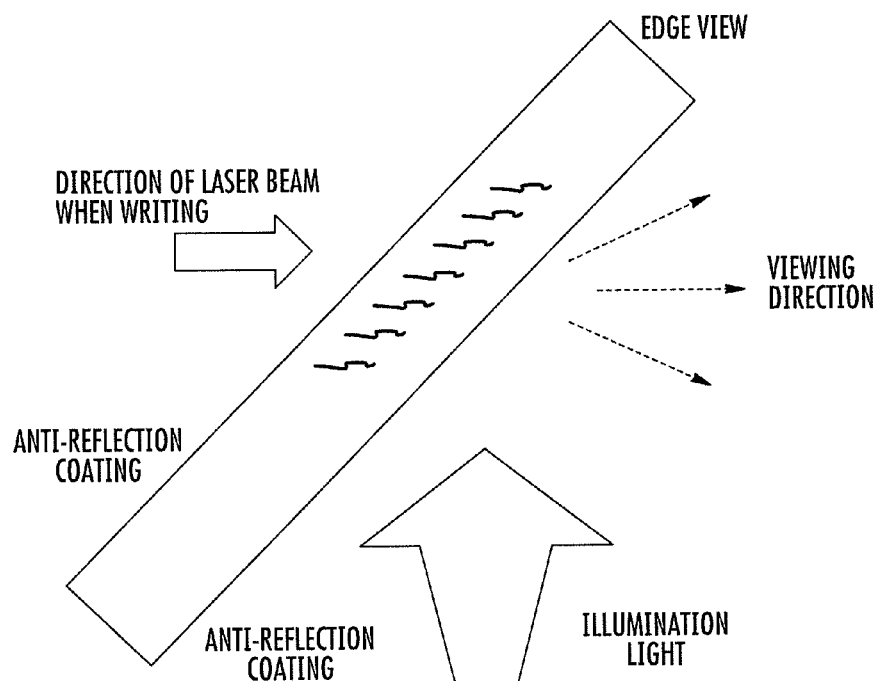

FIG. 18 is an illustration showing non-edge illumination of an Icon wherein the substrate is non-orthogonal to the writing, illumination, and/or viewing direction. This arrangement may be particularly useful when then substrate material plane is not perpendicular to the primary viewing direction, thus the micro-marks are not perpendicular to the material surface. An anti-reflection coating applied to one or more surfaces of the substrate reduces stray reflection.

Fabrication is likely to be easier and faster if the micro-marks are perpendicular to the material surface. However, the Visibility Trade-Off is likely to be less than optimal with this embodiment.

Projection Screen Concept

In the previous examples, the graphical pattern is written in the target material. This limits the flexibility of the display since the pattern cannot be changed or re-programmed later. A large, uniform field of micro-marks can also be used as a screen, with the graphics projected using different methods, such as a rapidly scanning mirror or an array of LEDs.

FIGS. 17 and 18, used to illustrate the Non-Edge Illumination above, can also be used to show the Project Screen Concept. The figures show the side-view of two arrangements where the viewing direction and the pattern projection direction are not perpendicular to the substrate surface. As noted in the preceding paragraph, the Illumination Light is stationary and simply illuminates the mark pattern in the substrate. In the Projection Screen Concept case, the Illumination Light is either steered by a fast actuation system to project the desired pattern on the Screen or a pattern of lights that is designed to produce the desired pattern is projected onto the Screen.

In FIG. 17, the micro-marks were written perpendicular to the substrate surface for easier fabrication. However, the micro-mark cross-section perpendicular to the to the illumination light direction is not maximized for better On-Visibility and the micro-mark cross-section parallel to the viewing direction is not minimized for optimal Off-Visibility.

In FIG. 18, the micro-mark axis is parallel to the viewing direction, minimizing the Off-Visibility. And the illumination light source direction is perpendicular to the micro-mark axis, maximizing the On-Visibility.

Acceptable contrast may be application dependent. Contrast between 10:1 to 100:1 is typically acceptable, depending on the type of viewing and detection system. For example, a 30:1 range may be more than adequate for viewing with a display. If a high grey scale resolution imaging system is utilized a contrast ratio of about 30:1 to 1000:1 may be preferred.

Grayscale Icons

In various embodiments Icons' processing conditions may be optimized for a Visibility Trade-Off. It is possible to make marks that scatter less using different processing conditions, such as a faster translation speed or lower pulse energy. By controlling these parameters, it is possible to create a "grayscale" Icon, where the "whiter" regions scatter less light and the "blacker" regions scatter more light, or vice-versa.

For example, a combination of laser parameters may produce a range of scattering of at least 10:1 or 30:1, and preferably up to about 100:1 to 1000:1. The contrast within the viewing direction will generally be affected by the angular distribution.

Though it is not necessary to the practice of embodiments of the present invention to understand the operative mechanism therein, we considered combining two fundamental phenomena: scattering contrast and scattering angle. Controlling scattering contrast with fine marks fulfilling the criteria, $C_{on} \gg C_{off}$, where $C_{on}$ and $C_{off}$ is the scattering coefficient with and without an artificial illumination, respectively. They are defined further by $$C_{on} = \left|\frac{(N+1)s\rho}{(N+1)s\rho + 2\kappa}\right| \text{ and } C_{off} = \left|\frac{s\rho}{s\rho + 2\kappa}\right|$$

where s is scattering cross section of the scattering structure, $\rho$ is density of the structure in the mark, and $\kappa$ denotes brightness of background. N is the ratio of brightness between the artificial illumination and background lighting. The size of the scattering structure is generally within the range of about 1/10 to 1/100 of the wavelength of the visible light.

In certain embodiments a device and process may be provided for control of scattering angle. Illumination angles with respect to background illumination may be considered, for example the illumination of light perpendicular to major background lighting. Such an arrangement is applicable to an icon-type of display with a vertically illuminated light with respect to the observing direction. A geometric structure of a mark and arrangement of a mark may also be considered. The scattering size control (in the range of 1/10 to 1/1000 of the visible light), is one fundamental aspect for Mie scattering. In order to extend the observable angle and better utilize the angular distribution of scattering, modulating the total internal reflection at the glass surface can be used as another control idea.

In various embodiments a suitable range of pulse energies, translation speeds, repetition rates are used so as to vary the exposure within the substrate. The increased exposure produces larger micro-marks which cause scattered light to be emitted over an increased angle relative to the viewing angle. If the directional reflectance is large within the viewing angle a feature will appear bright. If the same amount of light is scattered at a wide angle a feature will appear dark.

Alternative Materials

In some embodiments the surface and/or bulk of a material other than glass may be modified. One or more laser beams may form features detectable with a suitable arrangement for illumination and detection.

Some limitations discovered during our work with glass included relatively slow processing speeds and a requirement for relatively high pulse energy. For example, 200 ps pulses, 50 kHz repetition rates, and 13 μJ pulse energies were nearly optimal. For a typical spot size a speed of about 1 mm/second was typical.

Other limitations include some loss in performance related to a dependence of the micro-crack characteristics with mark depth, whereas substantial independence with depth is generally preferred.

Yet another limitation for certain applications is the fragility of glass and susceptibility to shatter, a potentially hazardous situation for some environments and applications. Therefore, applications of glass processing may be constrained or limited. Special handling and management of substrates may be needed in some applications, based on the required strength of the final product and safety in the environment it is used. One option would be to dispose the glass substrate between two pieces of polycarbonate. The polycarbonate would add strength to the assembly and contain the glass, should it shatter. Polycarbonate layers can also prevent surface contamination of the glass. Surface contamination can create scattering centers when illuminated, resulting in decreased On-Visibility contrast of the icon.

In some embodiments polycarbonate materials, or other polymers, may be utilized. For example, plastics, transparent polymers, and similar materials have some desirable characteristics. Some desirable material properties include: decreased weight (about 4-fold relative to a similar part made from glass), flexibility which allows bending of a substrate to form various shapes, decreased thickness which provides capability for increasing brightness with fixed edge illumination, and increased material strength with reduced susceptibility to shattering.

Experimental results, disclosed in the following section, demonstrated a significant improvement in processing speed and a simultaneous reduction in pulse energy.

Processing of polycarbonate or similar materials may be carried out using ultrashort pulse durations, with a substantial reduction in pulse energy compared to glass processing. Pulse durations may generally be less than about 10 ps. In some embodiments pulse durations may be in the range of about 100 fs to about 1 ps, for example about 500 fs. Pulse energies may be in a range of about 100 nJ to 1 µJ, for example about 0.5 µJ.

High repetition rates are preferred for rapid processing with significant pulse overlap for inducing thermal accumulation, for example at least 100 kHz. The parameters above may be applicable over a typical range of spot sizes of a few microns to tens of microns and translation speed from tens of microns to tens of meters per second Total pulse energy and spot size determine fluence at a focused spot location. The exemplary ranges above may be appropriately scaled for variations in spot size or other parameters, for example laser wavelength.

In some embodiments for glass processing pulse widths may be in approximate ranges of 10 fs to up to 1 ns, 10 fs-500 ps, or 100 fs to 200 ps. Pulse energies may be up to tens of microjoules, for example about 20 µJ to 50 µJ. In certain embodiments a pulse compressor may be omitted, but other components of a preferred fiber-based chirped pulse amplification system utilized.

The FCPA µJewel D-400 and D-1000, available from IMRA America, provide ultrashort pulse widths with total energy up to about 10 µJ with a repetition rate variable between 100 kHz and 5 MHz. In some embodiments, laser systems may include "all-fiber" systems for stretching, amplification, and compression.

Applications of switchable icons may be found in helmet shields, scuba masks, surgeon's glasses, safety face-shields, airplane canopies, eyeglasses, rearview mirrors, sunroofs, and headlight lenses. Marks can be written in mirrors, where these marks are normally difficult to see under ambient lighting (Off Visibility), but clearly distinguishable when edge-illuminated (On Visibility). Appropriate mirrors are those that use a transparent substrate, such as glass or polycarbonate, with a reflective coating on one surface. Laser processing is preferred for formation of features within a transparent medium. However, other processes may be used alone or in combination with laser processing. For example, etching, lithographic methods, chemical vapor deposition, and pulsed laser deposition may be utilized. In some embodiments a combination of laser processing and non-laser processing may be carried out 4. Multifocus Machining In addition to scribing, multifocus machining as illustrated in FIG. 5 may be utilized in cutting, welding, joining, marking, or other machining operations.

Various materials may be transparent, or nearly transparent, at non-visible wavelengths. For example, silicon is highly transmissive at about 1-1.1 µm, with near IR maximum transmission at about 1.2 µm. Therefore, multifocus micromachining may be carried out with various standard laser wavelengths, or in some cases at non-conventional wavelengths. In applications where processing is carried out near the bandgap, the absorption coefficient and its variation with temperature may need to be considered. For example, features may be formed within silicon at potential wavelengths of about 1.0-1.1 µm, 1.2 µm, 1.3 µm, 1.55 µm and the like. In some embodiments a non-conventional wavelength may be obtained with wavelength shifting a standard wavelength.

Ultrashort pulses may avoid excessive heating outside a focused spot impinging a target region, and associated collateral damage. Multifocus micromachining with ultrashort pulses may be advantageous for scribing and dicing of semiconductor substrates. For example, multiple elongated features may provide for cleaner separation of die than obtainable with single pass formation of internal lines within material.

Experimentally Demonstrated Results

1. Ultrashort Pulse Laser Scribing

Figure 19:
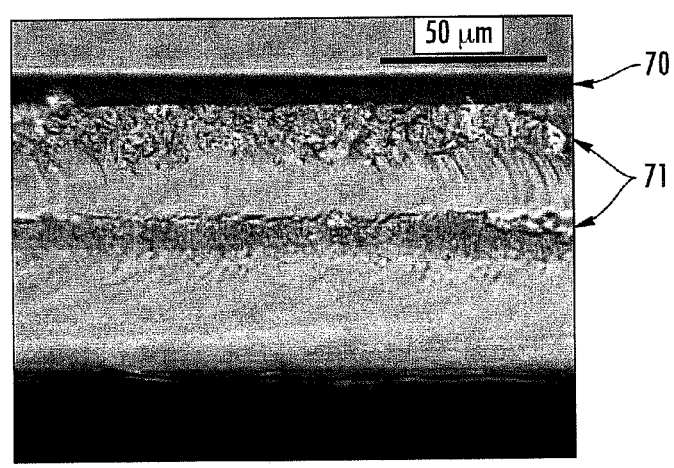
FIG. 19 is an optical micrograph showing experimental results of one embodiment of the laser scribing invention.

As shown in FIG. 19, with a single pass of the laser beam, a pair of scribe lines (a surface groove (70) and a sub-surface scribe feature (71)) were simultaneously machined in a 100-µm thick sapphire wafer using a 20× aspheric focusing objective (8-mm focal length). The cleave facet exhibits good quality. The scanning speed was 40 mm/s (not optimized).

For the case of a surface scribe line only, using the same laser pulse energy and repetition rate, and under identical processing conditions (ambient atmosphere environment, etc.), the fastest scribing speed which resulted in good cleaving of the material was ~20 mm/s.

2. Ultrashort Pulse Laser Welding

After a number of laser pulses are absorbed within a particular region of the materials to be welded, heating, melting and mixing of the materials occurs and, upon cooling, the separate materials are fused together. The number of pulses required to weld the materials together depends on other process variables (laser energy, pulse repetition rate, focusing geometry, etc.), as well as the physical properties of the materials. For example, materials with a combination of high thermal conductivity and high melting temperature require higher pulse repetition rates and lower translation speeds to achieve sufficient thermal accumulation within the irradiated volume for welding to occur.

A. Polycarbonate Welding

Experiments with a high-repetition rate, femtosecond pulse laser source operating at a pulse repetition rate of 200 kHz and having a wavelength of 1045 nm have resulted in the laser-joining of two optically-transparent materials. In particular, ~2 µJ laser pulses were focused with a 100 mm focal length lens through the top surface of a ¼"-thick piece of transparent polycarbonate, and onto its bottom surface interface with the top surface of a similarly-sized piece of transparent polycarbonate. The polycarbonate pieces were translated linearly and in a plane perpendicular to the direction of laser propagation, maintaining positioning of the beam focal region near-to the interface of the materials. The two pieces were fused together at the laser-irradiated interface and significant force was required to break them free from one another.

B. Fused Silica Welding

Figure 20:
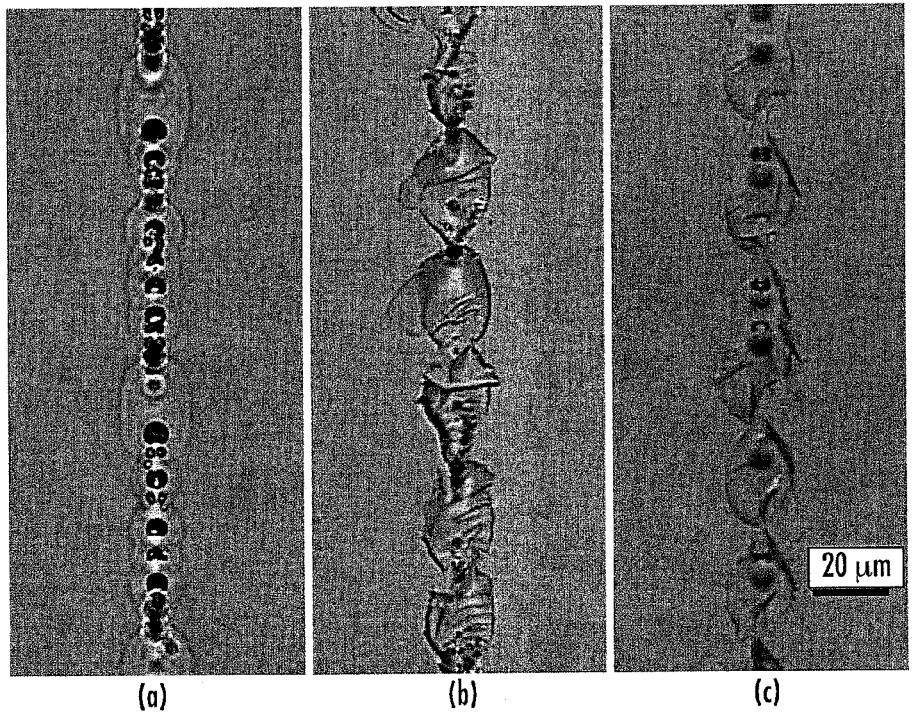
FIG. 20 is an image sequence showing a fused silica weld according to one embodiment of the current invention. (a) shows the fused silica before breaking apart the weld, (b) shows the bottom surface of the fused silica after breaking apart the weld, and (c) shows the top surface of the fused silica after breaking apart the weld.

A 200-µm thick fused silica plate was welded to a 1-mm thick fused silica plate using a 40× aspheric lens and a laser repetition rate of 5 MHz. The $1/e^2$ beam diameter of the laser was ~3.6 mm and the aspheric lens focal length was 4.5 mm, resulting in an operating NA (numerical aperture) of ~0.37. FIG. 20 shows a weld feature in fused silica, with images taken both before and after breaking the two silica plates apart. The first image (a) shows the intact weld feature exhibiting regions of smooth melted glass, and the subsequent images (b) and (c) show the two glass surfaces after the weld was fractured, exhibiting facets of fractured glass.

Welding speeds ranged from 0.1 to 1.0 mm/s, though speeds greater than 5 mm/s are possible, and the maximum speed could be increased with an increased pulse repetition rate. The nominal fluence range for the process is 5-15 J/cm$^2$ and the nominal pulse duration range is 10-1000 fs. Within these fluence and pulse duration ranges, the nominal pulse repetition rate range is 1-50 MHz. With rigorous process optimization, these ranges may be extended to 1-100 J/cm$^2$, 1 fs-500 ps, and 100 kHz-100 MHz for the fluence, pulse duration, and repetition rate, respectively. The high repetition rate is preferred for sufficient thermal accumulation for the onset of melting in the fused silica.

With the availability of higher energy pulses at similar repetition rates, looser focusing is possible to generate a larger focal volume with the required fluence. The size and shape of this welding focal volume can be tailored based on the region to be welded.

3. Visible/Invisible Laser Marks

Figure 9:
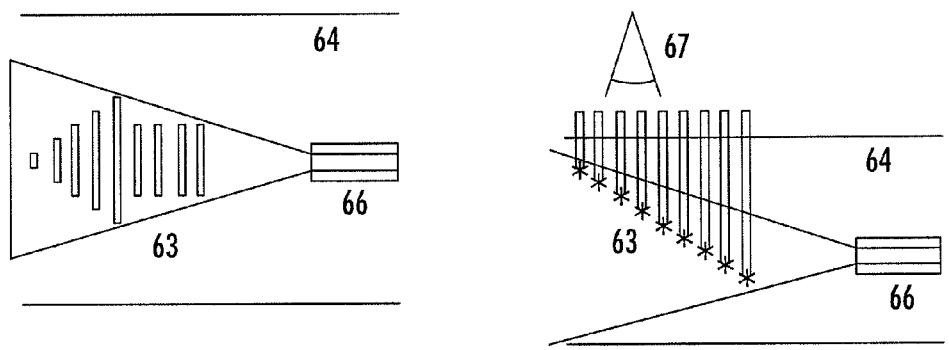
Figure 21:
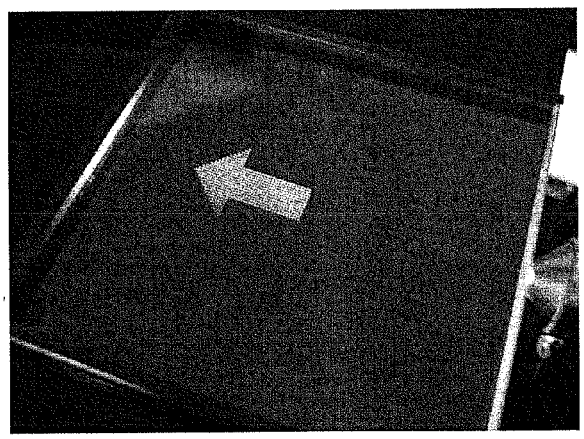

FIG. 21 shows a glass sample with the arrow mark illuminated by a green light source from the side. Here, the arrow pattern is clearly visible. The illustrations in FIGS. 8-10 show the details of the arrow pattern, where lines at different depths, perpendicular to the illuminating light source (green light in this case) were generated by tightly focusing the laser light. Laser parameters and scan speeds used to form such marks can be found in the table below.

Figure 22:
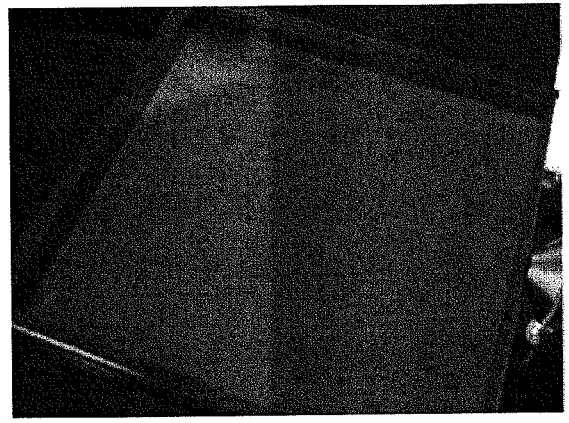

FIG. 22 shows the same glass sample with the illuminating light source off. Clearly, the arrow pattern cannot be seen.

Figure 23:
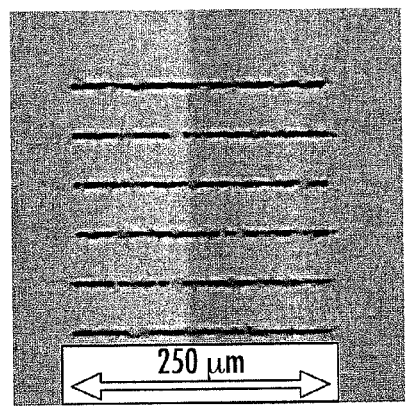

FIG. 23 shows a microscope photo of an individual pixel that is used to define the arrow mark in FIG. 21.

Figure 24:
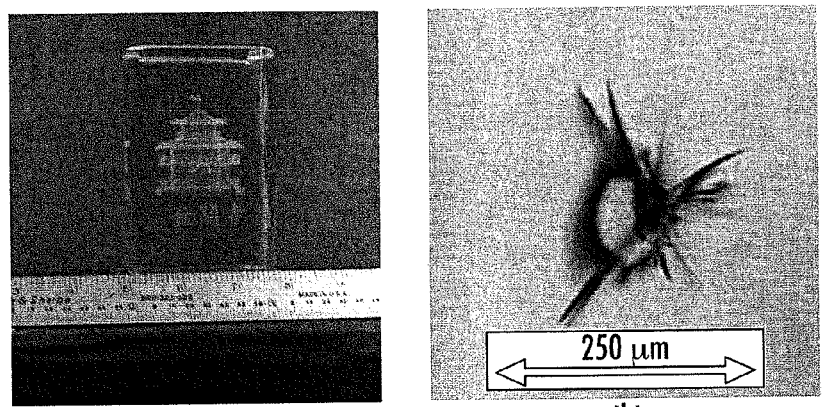
FIGS. 24a and 24b are photos of a prior art decorative article made by laser marking using a long-pulse laser, and an individual mark thereof.

FIG. 24(a) shows a photo of a decorative pattern inside glass and FIG. 24(b) shows a microscope image of an individual mark.

The mark in FIG. 24(b) is approximately 200 μm in size and very rough, composed of several distinct cracks radiating from the center. The pixel in FIG. 23 is made up of a series of parallel lines, each line is roughly 10 μm wide and 250 μm long. The line spacing is 50 μm. The difference in size and smoothness difference between the features in FIGS. 23 and 24(b) explains why the glass sculpture in FIG. 24(a) is clearly visible in most lighting conditions while the arrow in FIGS. 21 and 22 requires side illumination to be visible. The size and smoothness of the generated feature is controlled by the pulse energy, pulse duration, wavelength of the laser and the translation speed of the beam through the target. The optimal parameters depend on the particular target material. The visibility of the pixel in FIG. 23 can be controlled by controlling the width and length of each line in the pixel and the line density within the pixel as well as the smoothness.

Thus, one method for generating visible patterns of laser-modified features below the surface of the transparent material proceeds by first forming a plurality of lines at different depths within the material using a tightly focused ultrafast pulse laser, while controlling the roughness of the lines by controlling parameters of said laser as described. The lines are then illuminated using light propagating or directed generally perpendicular to the lines. The patterns formed in this way are clearly visible to the unaided eye when illuminated from the perpendicular direction, although they are substantially invisible to the unaided eye when not illuminated; i.e., under normal ambient light conditions as in FIG. 22. The illumination is conducted by directing a focused light source upon the lines or by directing the light to the lines via an optical waveguide with an output numerical aperture selected to efficiently illuminate the pattern.

Different ones of said lines, for example the lines of different pixels, can be at defined angles relative to one another, and can be illuminated separately or simultaneously by arranging multiple light sources so that they each direct light generally perpendicular to a subset of said lines.

Results were also obtained with polycarbonate samples and compared with glass. FIGS. 25*a* and 25*b* show respective cross sections obtained from glass (left figure, a) and polycarbonate (right figure, b) samples. FIGS. 24*a* and 24*b* show marks made with nanosecond pulses, wherein FIG. 24*b* is an expanded view of a portion of the pattern in FIG. 24*a*. The images were taken using an optical microscope with brightfield illumination. The mark in polycarbonate has a narrower width with a comparable depth, suggesting a better Visibility Trade-Off.

It is instructive to compare the marks in FIGS. 25*a* and 25*b* with the decorative sculpture mark made by a long-pulse laser shown in FIGS. 24*a* and 24*b*. The long-pulse laser mark is much larger and spherically symmetric, making it clearly visible in most illumination conditions from all directions.

Yet another advantage of polycarbonate is associated with laser processing parameters.

With polycarbonate, an increase in the processing speed resulted with more than a ten-fold decrease in pulse energy as shown in the table below. The material modification threshold for polymers is typically lower than for glass. An interesting observation is the material modification process appears to be different in glass and in polycarbonate. With glass, the micro-cracks are most likely caused by micro-explosions. When the laser focus is near the surface, the fracture can propagate to the surface. With polycarbonate, it does not appear to be a micro-explosive process, but gentler, thus the lower pulse energy required. When the beam is focused near the surface, there is no surface modification.

| Process Condition | Glass | PC |
| --- | --- | --- |
| Pulse Energy | 13 μJ | 0.5 μJ |
| Pulse Duration | 200 ps | 500 fs |
| Laser Repetition Rate | 50 kHz | 100 kHz |
| Translation Speed | 1 mm/s | 50 mm/s* |

*: 1 m/s with 2 MHz Repetition Rate

The lower fluence used for polycarbonate is not necessarily related to the shorter pulse, as determined from data on glass using 500 fs pulses, where shorter pulses resulted in less scattering. It is possible that the material modification process in glass using ultrashort pulses shorter than about 10 ps results in changes in the index of refraction and does not scatter as much light compared to micro-cracks. In any case, the reduction in pulse energy to 0.5 uJ and a corresponding speed increase provides for considerable improvement and applicability.

Reflective marks, similar to those illustrated in FIGS. 13*a*-13*d* were formed in samples of microscope slide glass, window glass, and chemical-resistant borosilicate glass. Our test results showed reflective marks may be formed using ultrashort pulses with pulse duration in the range of about 300 fs to about 25 ps, with pulses focused below the surface with numerical aperture between 0.3 and 0.55. The laser pulses were produced at repetition rates of 50 kHz and 100 kHz. The average power in the experiments was up to 1 W, with laser scanning speed up to 200 mm/s.

Laser parameters used to form the reflective marks differ from scattering mark parameters in several ways. A relatively short pulse duration was used to form reflective marks, for example a pulse duration in the range of about 300 fs-25 ps. Much longer pulses, for example about 200 ps, are suitable for making some scattering marks in the same processed material, for example window glass. In addition, the experiments showed a wider range of speed and power levels are suitable to make the reflective marks. Conversely, lower repetition rates were best for creating the scattering marks in glass at much higher average power, with reduced scan speed, for example up to 1 mm/s. However, low power, short pulses were sufficient to make scattering marks in plastic samples.

4.0 Multifocus Machining Examples

Experiments were carried out using a wavelength combining process as illustrated in FIG. 5c, and included preliminary single-beam experiments to test feature formation at various depths, and to adjust parameters to avoid shattering. Soda lime glass, tempered glass, and sapphire samples were processed. Soda lime glass (e.g.: a microscope slide) having 1 mm thickness was first tested because of its low laser modification threshold and low cost. Tempered glass and sapphire are of considerable interest because of widespread industrial use and potential challenges with laser machining.

Tempered glass is used in numerous industrial applications because of scratch resistance, bending tolerance, and ruggedness. Glass may be tempered, through a thermal, chemical or other process, so that the material near the surface is under compressive stress while the material near the center is under tensile stress. The glass near the surface that is in compressive stress is more resistant to scratching.

A chemical process is used to temper the glass by diffusing larger potassium atoms into the aluminosilicate glass structure. In order to increase the surface strength and abrasion/scratch resistance, a cover glass may be chemically tempered on the surface. Such tempering process introduces compression on the glass surface and tension elsewhere, which could be challenging for machining.

Ultrashort machining results are illustrated below. Ultrashort pulsed beams focused below the surface of the glass can create lines or other features along the desired breaking or cutting direction. By initiating the cut at the center of the glass where the stress distribution is more symmetric and under tensile stress, better control of the breaking action compared to cutting at the surface may be obtainable. Pulse widths less than about 10 ps are suitable, and sub-picosecond pulses preferred. In some embodiments pulse widths of several tens of picoseconds may be utilized.

Multiple passes can be used to cut the tempered glass, where the initial pass(es) create some material modification, but no cracking or breaking. A subsequent pass of the laser can then be used to initiate and propagate the crack along the initial laser-modified path. However, speed is limited.

Some experiments suggested a chemically tempered glass is easy to shatter if stress distribution is disrupted. Perhaps the stress distribution across the thickness of chemically tempered glass is different from thermally tempered glass. However, multifocus micromachining did produce a smoother break surface compared to only surface scribing.

A. Tempered Glass

Capability for scribing and breaking tempered glass was tested with ultrashort laser pulses, including dual-wavelength, multiple beam processing. Cover glass plates 700 μm thick were utilized in these experiments. Some commercially available tempered glass is specifically designed for portable electronics, for example for use as a touch screen, with chemically tempered surfaces and has thickness from 700 μm to 2 mm.

Scribing at Various Depth—Multiple Scans

To avoid possible shattering, lines of laser exposures were first tested at ~240 μm beneath the sample's front surface, and then gradually raised to ~120 μm above the surface. The FCPA μJewel D-1000 laser system was used for scribing of the tempered glass, with the following parameters:
Laser: IMRA FCPA μJewel D-1000
Wavelength: SHG @ 523 nm
Pulse repetition rate: 100 kHz
Focusing lens: 16× asphere coated for SHG
Laser power: 400 mW SHG
Scan speed: 20 mm/s
Focus depth: −240 μm (internal) to +120 μm (above surface)

FIG. 26-a illustrates a series of images obtained with the above laser parameters, with some results showing dependence on the focus position with respect to the top and bottom surfaces of the glass. The first row corresponds to top-view images of the laser-exposed lines with the laser focus adjusted from −240 μm (inside the glass) to +120 μm (outside the glass) to the sample front surface. The second row illustrates laser machined lines with similar conditions when the sample was flipped over and laser focus was adjusted from −240 μm (inside the glass) to +80 μm (outside the glass) to the sample back surface. In this experiment, the scribe lines near or on the front surface have different characteristics than scribe lines near or on the back surface. Referring back to the example of FIG. 4, example beam focal volume constant-intensity contours near the beam waist are illustrated, including an outer contour having a concave shape with axially varying diameter (e.g.: resembling a "dumbbell"). When processing different materials with different laser parameters and focusing conditions, the position within the beam where the fluence exceeds the ablation threshold is not necessarily at the focus, but can be at an outer contour position. Therefore, it is possible to position the beam focus at different depths to produce different modification features, based on the portion of the focal volume that is used, resulting in improved control over the depth of the machined features. In this example, cracks were noticed near the ablation line when the beam focus was near or on the front surface. For the back side, such crack didn't occur for the same range of machining conditions. This suggests that the stress distribution across the tempered glass thickness is not symmetric.

The tempered glass sample was slightly curved: the front surface is concave, and the back surface is convex. This might be caused by stress introduced in the glass rolling process, or an uneven degree of tempering on the glass front and back surfaces. In any case, the depth-scanning exposures proved that the tempered glass does not shatter upon femtosecond laser surface or internal machining. Surprisingly, the crack only appears when the focus is below the front surface or above the front surface, but not when focused on the front surface. Without subscribing to any particular theory, it is possible that when the beam is focused below the front surface, some material modification occurs which then releases the tensile force and generates the crack. Then the surface is ablated. The +80 μm case is different. Ablation experiments with various powers showed that with focus on the surface never produced such cracks.

Scribe and Break

Figure 26A:
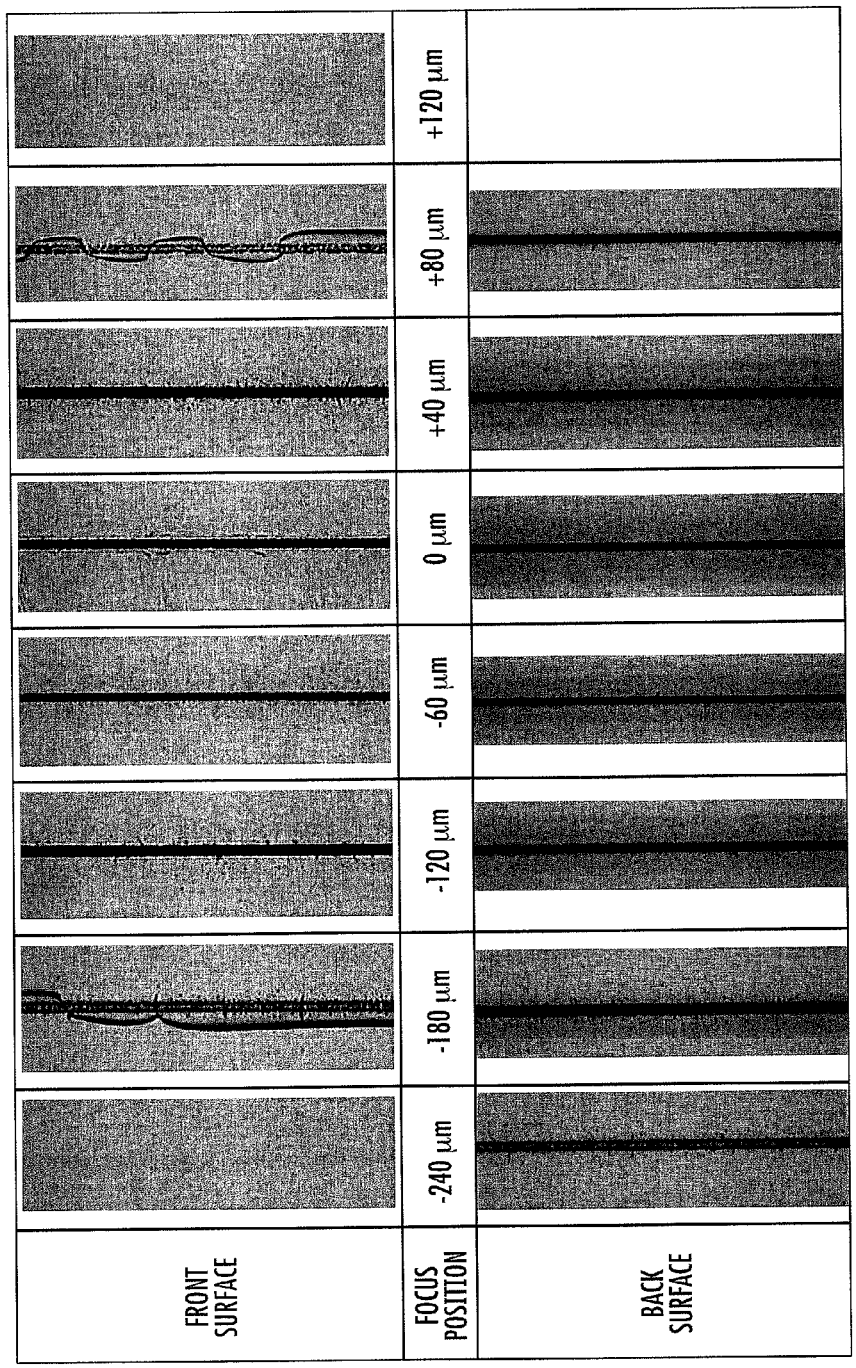
FIGS. 26a-26d illustrate various experimental results obtained with tempered glass and sapphire material samples. Microscope images illustrate results obtained with an IR/green, collinear, multifocus beam generator providing beams focused at multiple depthwise locations and various lateral (X-Y) locations.
Figures 1, 26B:
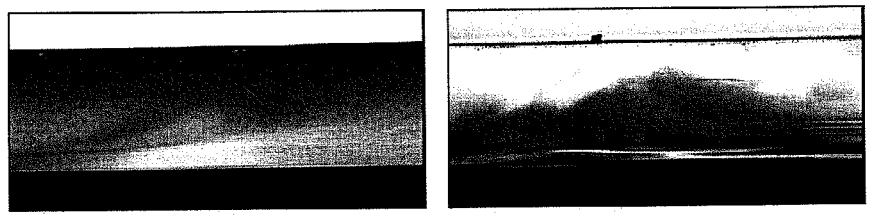
Figures 2, 26B:
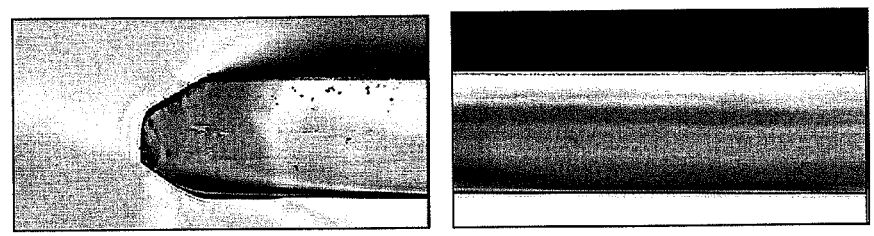

The glass was then tested for scribe and break process. At first, a single surface ablation line was used which was formed with 20 mm/s scan speed, 400 mW SHG power, and laser focus at −30 μm. FIG. 26b-1 shows the break facet of the glass with traces of cracks (left) and surface roughness (right).

Cracks are reduced with multiple scans at different depths. FIG. 26b-2 shows the break facet when four laser passes were used: surface ablation at Z=−30 μm, and internal marks at −700 μm, −450 μm, −300 μm, respectively. Traces of internal modifications were detected in these images.

Collinear Dual-Wavelength Scribe-and-Break

Figure 26C:
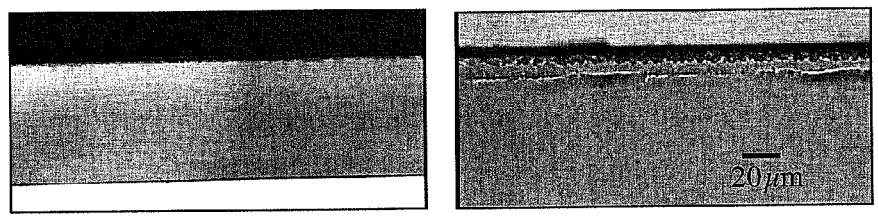

Collinear dual-color scribe was also tested for the tempered glass. A broad range of power combinations (SHG and IR) were explored. The glass broke cleanly with the following parameters:

Laser: IMRA FCPA μJewel D-1000
Pulse repetition rate: 100 kHz
Wavelength: SHG and IR
Power: 150 mW SHG, and 460 mW IR
Focus: IR at surface, SHG at 200 μm beneath surface
Scan speed: 20 mm/s FIG. 26c shows the clean break after the collinear dual process, taken with 5× and 50× microscope objectives, respectively. The top surface damage was minimal and no signs of cracks can be observed (right image). Unexpected multiple horizontal lines are visible near the bottom of the break (left image), but did not limit processing; the clean break was obtained The results demonstrate that collinear ultrashort pulses may be used with a multifocus beam generator to create multiple features within the substrate, and to process the tempered glass in such a way that clean separation can be achieved. Moreover, the number of passes may be reduced and overall speed increased.

B. Sapphire

Figure 26D:
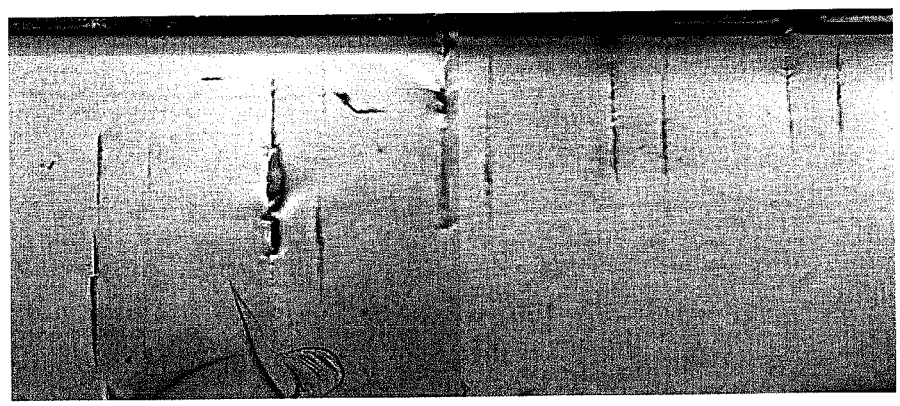

Experiments were also carried out with Sapphire. Two distinct subsurface features have been produced. However, successful breaks along the scribe line were not obtained. The processing of this test wafer may be limited by the wafer thickness of about 0.5 mm, relative to the size of the subsurface features. Such large thickness may be excessive for the size of the scribe modifications created. The two lines at each depth in FIG. 26d are separated by 25 μm. Additional collinear scribe passes at different depths are expected to provide acceptable cleave results.

VARIOUS EMBODIMENTS AND FEATURES

Thus, the inventors disclosed methods and systems for transparent material processing with an ultrashort laser, and articles made there from. Processes include, but are not limited to, cutting, scribing, welding, marking, and/or joining. Various combinations of spatial and temporal processing, for example sequential or parallel processing, may be utilized.

At least one embodiment includes a method of scribing a transparent material. The method includes using a single scan of a focused beam of ultrashort laser pulses to simultaneously create a surface groove in the material and at least one modified region within the bulk of the material.

At least one embodiment includes a method for scribing a transparent material. The method includes using a single scan of a focused beam of ultrashort laser pulses to simultaneously create a plurality of modification regions within the bulk of the material.

At least one embodiment produces a transparent material scribed at two or more points in a depth direction thereof by a single scan of a focused beam of ultrashort laser pulses.

At least one embodiment includes a method for welding transparent materials. The method includes focusing a beam of ultrashort laser pulses near an interface between the materials, and producing the ultrashort laser pulses at a repetition rate and with one or more zones of fluence sufficient to induce localized melting of the materials at the interface.

At least one embodiment includes a method for welding transparent materials. The method includes directing a beam of ultrashort laser pulses to near an interface between the materials, to induce non-linear absorption of energy proximate at least one high intensity region of the beam, and to deposit and accumulate heat at the region with repeated pulses sufficient to cause localized melting of the materials.

At least one embodiment includes a method for creating a raised ridge at the interface between two opposed surfaces to be welded to fill a gap that cannot be bridged by welding alone. The method includes focusing ultrashort laser pulses below one or both of the opposed surfaces on which the ridge is to be formed, to raise the ridge, and subsequently laser welding the raised ridge and the opposite surface or ridge.

At least one embodiment includes an optical system for welding transparent materials. The system includes a laser system that produces a beam of femtosecond to picosecond regime ultrashort laser pulses, and a focusing element for focusing the beam near an interface between the materials, wherein the laser system has a pulse repetition rate, and the pulses have a zone of higher fluence, which are cumulatively sufficient to induce localized melting of the materials at the interface.

At least one embodiment includes an optical system for welding materials. The system includes a laser system that produces a beam of ultrashort laser pulses, and a focusing element for focusing the beam near an interface between the materials. The beam, at the interface, has an intensity insufficient to ablate the materials, but the laser system has a pulse repetition rate high enough to cumulatively induce localized melting of the materials at the interface. At least one of the materials is transparent to the wavelength of the laser system.

At least one embodiment includes a method for welding transparent materials. The method includes directing a beam of ultrashort laser pulses to near an interface between the materials, and optically controlling formation and spatial position of one or more areas of high intensity within a body of the materials, to induce melting of the materials only within the zone or zones.

At least one embodiment includes a method for generating patterns of laser-modified features below a surface of a transparent material. The method includes: forming a plurality of lines at different depths within the material using tightly focused ultrashort laser pulses; controlling the roughness of the lines by controlling parameters of the laser; and illuminating the lines using light propagating generally perpendicular to the lines.

In various embodiments:

the patterns are clearly visible to the unaided eye when illuminated from the perpendicular, and substantially invisible to the unaided eye under ambient light.

an illuminating step is conducted by directing a focused light source upon the lines or by directing the light to the lines via an optical waveguide with an output numerical aperture selected to efficiently illuminate the pattern.

different ones of the lines are at defined angles relative to one another, and the illuminating step is performed by directing light to the lines from plural sources, each one of which directs light in a direction generally perpendicular to a subset of the lines.

a pulse width of the ultrashort pulses is less than about 1 ns, and the transparent material includes a transparent polymer.

the total energy within a tightly focused ultrashort pulse is less than about 20 μJ.

the controlling comprises adjusting at least one of scattering contrast and scattering angle.

the transparent material includes polycarbonate, and a tightly focused ultrashort pulse has a pulse width less than about 1 ps, pulse energy less than about 1 μJ.

relative motion is produced between the ultrashort pulses and the material; and the method includes controlling a depth to width aspect ratio of said lines by controlling parameters of said laser and said motion in such a way that a cross-sectional area of the pattern is smaller along a viewing direction compared to along an illumination direction.

At least one embodiment includes a method of controlling the visibility of laser-induced sub-surface markings in a transparent material by controlling the width, length and smoothness of individual lines, and the density of the lines that make up the markings.

At least one embodiment produces a material having patterns of sub-surface markings formed by a laser, wherein the markings are formed of lines at different depths within the material, the lines being substantially visible to the unaided eye only when illuminated with a light source directed generally perpendicular to the lines.

At least one embodiment includes a device for generating a detectable spatial pattern in response to controlled irradiation. The device includes: a substantially transparent medium having at least one feature formed therein, the at least one feature having a depth, width, and a physical property for producing detectable radiation along a detection direction in response to controlled irradiation incident along a irradiation direction, the detectable radiation being representative of the spatial pattern. At least the physical property substantially limits detection along the detection direction in response to unwanted radiation.

In various embodiments:

the device comprises features which fill a geometric shape corresponding to the pattern.

the device comprises features formed at different depths within the medium such that one or more detectable spatial patterns are generated in response to depthwise controlled irradiation, thereby providing a switchable spatial pattern.

the device comprises multiple layers of transparent materials, and the depthwise controlled radiation is constrained by total internal reflection within a layer so as to irradiate only features within or proximate to the layer.

at least a portion of the controlled irradiation is incident along at least a second direction, and the features are formed at multiple orientations.

the device includes at least one region within the device configured to receive radiation from at least one source and to guide the radiation along the first direction so as to produce the controlled irradiation.

the ratio of depth to width is greater than about 10.

the device includes a material having at least one of flexible and substantially shatterproof property.

the medium includes two or more different transparent materials, at least one material having at least one of flexible and substantially shatterproof property.

at least a portion of the device comprises a polymer.

at least a portion of the device comprises polycarbonate.

the at least one feature is formed using one or more focused ultrashort laser pulses.

the features are formed as an array, and the array is selectively irradiated to project the spatial pattern.

the features form an array, and wherein the detectable radiation from elements of the array varies as a result of at least one of the irradiation or the physical property, wherein the pattern corresponds grey scale pattern.

At least one embodiment includes a system for generating patterns of laser-modified features below the surface of a transparent material. The system includes: a laser sub-system producing pulses having pulse widths in the range of about 10 fs to about 500 ps. A positioning system is included to position the pulses relative to the material, and an optical system to focus the pulses and to form at least one feature within the material. The at least one feature has a depth, width, and a physical property for producing detectable radiation along a detection direction in response to controlled irradiation incident along a first irradiation direction.

In various embodiments:

the pulses have pulse widths in the range of about 100 fs to 200 ps, and wherein the laser source comprises a fiber-based chirped pulse amplifier system.

At least one embodiment includes a system having a device for generating a detectable spatial pattern in response to controlled irradiation; and an illuminator for selectively irradiating the device so as to form at least one detectable spatial pattern.

In various embodiments:

the means for selectively irradiating includes a plurality of radiation sources.

the means for irradiating comprises a non-spherical optical component for producing an elongated beam and for projecting the elongated beam along the first irradiation direction.

the system includes a detection system disposed along the detection direction.

the means for irradiating includes a scanning mechanism to selectively irradiate at least a portion of the device.

At least one embodiment includes a laser-based system for modification of a transparent material. The system includes: a pulsed laser apparatus generating a pulsed laser output and a multifocus beam generator receiving the output. The generator is configured to form a plurality of focused beams using the output, each focused beam having a beam waist, the beam waists spaced depthwise relative to the material, with at least one beam waist of the plurality of focused beams being within the material and causing modification of the material. A motion system is included to produce relative movement between the material and the focused beams. A controller is coupled to the pulsed laser apparatus and to the motion system, and controls the system in such a way that the plurality of focused beams are formed during the relative motion.

In various embodiments:

the multifocus beam generator comprises a wavelength converter, and the focused beams comprise multiple wavelengths.

a first wavelength is an IR wavelength and a second wavelength is a visible or near UV wavelength longer than an absorption edge of the material.

the multifocus beam generator comprises polarizing elements, and the focused beams comprise multiple polarizations.

the polarizations comprise a circular polarization.

the depthwise spaced beam waists are formed at collinear locations along the propagation direction of the focused beams.

the plurality of focused beams are formed during an irradiance time interval, and the relative movement during the time interval produces a relative displacement less than about a beam waist diameter of a focused beam. The depthwise spaced beam waists are formed approximately along a normal direction to the surface, and within a localized region corresponding to a portion of a plane approximately normal to the surface.

the focused beams are formed during an irradiance time interval less than about 10 ns, and the relative movement comprises a speed in the range of about 1 mm/sec up to about 10 m/sec.

at least one generated pulsed output comprises a laser pulse having a pulse width in the range of about 10 fs to 100 ps.

the multifocus beam generator comprises beam splitters and beam combiners configured to propagate beams along multiple optical paths, and focusing elements configured to control focus of the beams and to form the depthwise spaced beam waists.

the system includes a beam deflector and the system comprises a scan lens disposed between the material and the beam deflector.

the pulsed laser apparatus generates laser output pulses at a repetition rate in the range of about 10 Khz to 100 Mhz, and the multifocus beam generator is configured to form the plurality of focused beams at the repetition rate.

the multifocus beam generator includes a diffractive optical element (DOE) that forms at least two depthwise spaced focused beam portions.

At least one embodiment includes a laser-based method for modification of a material. The method includes: generating pulsed laser beams; forming a plurality of focused pulsed beams, each beam having a beam waist, the beam waists spaced depthwise relative to the material, at least one of the beams waists being within the material and causing material modification within the material that generates at least one sub-surface feature. The method includes producing relative motion between the material and the focused beams. The method includes controlling the forming and the moving in such a way that the plurality of focused pulsed beams are formed during the motion.

In various embodiments:

at least one sub-surface feature is formed, the feature comprising at least of an elongated shape and a circular shape.

the features are formed with a depthwise spacing that results in clean separation of the material during a mechanical separation process.

the material comprises a tempered glass.

the material comprises sapphire, or a semiconductor, and the focused pulsed beams comprise a wavelength at which the material is highly transmissive.

the features are formed that modify both a surface portion and a sub-surface portion of the material.

at least one focused pulsed beam comprises a pulse having a pulse width less than about 100 ps.

at least one focused beam creates a fluence in the range of about 1 J/cm$^2$ to 150 J/cm$^2$ within the material.

At least one embodiment includes a laser-based method for material modification. The method includes focusing and delivering a plurality of laser beams along a collinear direction so as to form multiple features having a spatial arrangement depthwise relative to the material, and during controlled relative motion between the pulses and the material.

In various embodiments:

the spatial arrangement is pre-selected to provide clean separation of the material during a separation process.

At least one embodiment includes an article made by the above method, of laser based-material modification, and with an additional step of separating material to obtain a material portion of the article.

At least one embodiment includes a laser-based system for modification of a material. The system includes: a pulsed laser apparatus generating pulsed laser beams; a means for forming a plurality of focused pulsed beams spaced depthwise relative to the material, at least one of the plurality of focused pulsed beams having a beam waist formed within the material and causing material modification within the material that generates at least one sub-surface feature. The system also includes a means for producing relative motion between the material and the focused beams. A controller is included for controlling the forming and the moving in such a way that the plurality of focused pulsed beams are formed during the motion.

In various embodiments:

the plurality of beams are formed simultaneously.

the controller is coupled to the multifocus beam generator. The controller is configured to control at least one of polarization, wavelength, fluence, and beam waist position.

the beam waists are formed with depthwise separation less than a beam waist diameter.

multiple sub-surface features are formed having spatial overlap along a depthwise direction relative to the material.

the focusing and delivering forms the features simultaneously.

In at least one embodiment the plurality of depthwise focused beams are utilized in a scribing and breaking process.

In at least one embodiment the plurality of depthwise focused beams are utilized in a process for transparent material marking.

In at least one embodiment the plurality of depthwise focused beams are used in a welding or joining process.

In at least one embodiment a multifocus beam generator comprises a wavelength converter and polarizing elements, and is configured to form focused beams comprising both multiple wavelengths and multiple polarizations focused at different positions or depths.

At least one embodiment includes a method for generating patterns of laser-modified features below a surface of a transparent material. The method includes forming a plurality of lines at different depths within the material using tightly focused ultrashort laser pulses, and controlling laser parameters such that at least one line comprises an extended planar region having a strong specular reflection component.

In various embodiments a pulse width in the range of about 300 fs to 25 ps is used to form a reflective mark.

Thus, the invention provides a transparent material having patterns of sub-surface markings formed by a laser, e.g. an ultrafast pulse laser, where the markings are formed of lines at different depths within the material, with the lines being substantially visible to the unaided eye only when illuminated with a light source directed generally perpendicular to the lines.

Thus, while only certain embodiments have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the embodiments described therein.

What is claimed is:

1. A laser-based method for modification of a material, comprising:

generating a pulsed laser input beam, said pulsed laser input beam comprising a pulse width less than about 100 ps;

forming a plurality of focused pulsed beams with different polarizations or different wavelengths from said pulsed laser input beam, said forming comprising:

spatially separating said pulsed laser input beam to form at least two pulsed beams propagating in at least two respective beam paths; and combining said at least two pulsed beams to form a plurality of collinear beams along a common output propagation path, and focusing said at least two pulsed beams;

wherein each focused pulsed beam comprises a beam waist, respective beam waists of said focused pulsed beams being separated and spaced depthwise along the common output propagation path relative to said material, at least one of said beam waists of said focused pulsed beams being within said material and causing material modification within said material that generates at least one sub-surface feature;

producing relative motion between said material and said focused pulsed beams; and controlling said forming and said moving in such a way that said plurality of collinear, depthwise separated focused pulsed beams having said different polarizations or different wavelengths are simultaneously delivered to said material during said motion.

2. The method of claim 1, wherein at least one sub-surface feature is formed, said feature comprising at least one of an elongated shape and a circular shape.

3. The method of claim 1, wherein a depthwise spacing between a surface feature and said subsurface feature, or between plural ones of said subsurface features results in clean separation of said material during a mechanical separation process.

4. The method of claim 1, wherein said material comprises a tempered glass.

5. The method of claim 1, wherein said material comprises sapphire, or a semiconductor, and said focused pulsed beams comprise a wavelength at which said material is highly transmissive.

6. The method of claim 1, wherein at least one of said beam waists of said plurality of focused beams causes material modification at a surface of the material.

7. The method of claim 1, wherein at least one focused beam creates a fluence in the range of about 1 J/cm² to 150 J/cm² within the material.

8. The method of claim 1, wherein said respective beam waists of said plurality of focused pulsed beams are formed with depthwise separation less than a beam waist diameter.

9. The method of claim 1, wherein multiple sub-surface features are formed having spatial overlap along a depthwise direction relative to said material.

10. The method of claim 1, wherein said plurality of focused pulsed beams comprises multiple wavelengths.

11. The method of claim 10, wherein at least one of said multiple wavelengths are generated by frequency conversion of a beam propagating in one of said beam paths.

12. The method of claim 1, wherein said plurality of focused pulsed beams are respectively of different polarizations.

13. The method of claim 12, wherein at least one of said different polarizations is generated by modifying a polarization of said pulsed laser input beams.

14. The method of claim 12, wherein a surface groove is formed with a focused pulse beam, and a polarization is pre-selected to affect the aspect ratio, a depth of said surface groove, or both.

15. The method of claim 12, wherein said different polarizations are respectively parallel or perpendicular to a predetermined direction of motion of the material relative to said focused pulsed beams.

16. The method of claim 1, wherein at least two of a plurality of focused pulsed beams are time separated by less than about 10 ns.

17. The method of claim 1, wherein at least two of a plurality of focused pulsed beams are time separated by about 10 ps-100 ps.

18. The method of claim 1, wherein at least two focused pulsed beams comprise different pulse widths, said pulse widths being in the picosecond or nanosecond range.

19. The method of claim 18, wherein said material modification is obtained by scribing, welding, or internal marking of said material.

20. The method of claim 1, wherein a polarization sensitive optical element in disposed in one beam propagation path to modify a beam polarization and a wavelength converter is disposed in one beam propagation path to modify a wavelength.

* * * * *